(12) United States Patent
Lee et al.

(10) Patent No.: US 10,689,403 B2
(45) Date of Patent: Jun. 23, 2020

(54) METHOD FOR PREPARING FOUR-COORDINATED ORGANIC BORON COMPOUND

(71) Applicant: KOREA RESEARCH INSTITUTE OF CHEMICAL TECHNOLOGY, Daejeon (KR)

(72) Inventors: Kee In Lee, Daejeon (KR); Venkata Subbaiah Sadu, Daejeon (KR); In Taek Hwang, Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 0 days.

(21) Appl. No.: 15/557,059

(22) PCT Filed: Mar. 10, 2016

(86) PCT No.: PCT/KR2016/002375
§ 371 (c)(1),
(2) Date: Jan. 23, 2018

(87) PCT Pub. No.: WO2016/144106
PCT Pub. Date: Sep. 15, 2016

(65) Prior Publication Data
US 2018/0298034 A1 Oct. 18, 2018

(30) Foreign Application Priority Data
Mar. 10, 2015 (KR) ........................ 10-2015-0033383

(51) Int. Cl.
*C07F 5/02* (2006.01)
*C09K 11/06* (2006.01)
*H01L 51/00* (2006.01)

(52) U.S. Cl.
CPC ................ *C07F 5/025* (2013.01); *C07F 5/02* (2013.01); *C09K 11/06* (2013.01); *H01L 51/0077* (2013.01); *C09K 2211/1029* (2013.01); *C09K 2211/1033* (2013.01); *C09K 2211/1037* (2013.01); *C09K 2211/1044* (2013.01); *C09K 2211/1088* (2013.01); *C09K 2211/1092* (2013.01)

(58) Field of Classification Search
CPC ....................................................... C07F 5/02
USPC ........................................................ 546/13
See application file for complete search history.

(56) References Cited

U.S. PATENT DOCUMENTS

| 2004/0224923 | A1 | 11/2004 | Lee et al. | |
|---|---|---|---|---|
| 2005/0070503 | A1 | 3/2005 | Lee et al. | |
| 2006/0014723 | A1* | 1/2006 | Bellinger-Kawahara | ................... A61K 31/69 514/64 |

FOREIGN PATENT DOCUMENTS

| JP | 2006511613 A | 4/2006 | |
|---|---|---|---|
| JP | 2008-502694 A | 1/2008 | |
| KR | 10-2012-0023810 A | 3/2017 | |
| WO | 2002-044184 A2 | 6/2002 | |
| WO | WO 2004/056322 A2 * | 7/2004 | ................ C07F 5/02 |
| WO | 2005-123095 A1 | 12/2005 | |

OTHER PUBLICATIONS

Frath, Denis, et al., "Luminescent Materials: Locking p-Conjugated and Heterocyclic Ligands with Boron(III)" Angew. Chem. Int. Ed. 2014, 53, 2290-2310.
Rao, Ying-Li, et al., "Four-Coordinate Organoboron Compounds with a π-Conjugated Chelate Ligand for Optoelectronic Applications," 2011 American Chemical Society, Inorg. Chem. , 2011. vol. 50 , pp. 12263-12274.
Wu, Qingguo et al., "Synthesis, Structure, and Electroluminescence of BR2q (R) Et, Ph, 2-Naphthyl and q ) 8-Hydroxyquinolato)" Chem. Mater. 2000, 12, 79-83.
Lee, Kee-In, et al, "[5-Hydroxy-3-phenyl-1-(pyridin-2-yl)-pyrazol-5-olato]diphenylboron" Acta Cryst . 2011. E67. 0979.
Li, Di, et al., "Four-coordinate organoboron compounds for organic light-emitting diodes (OLEDs)," Chem. Soc. Rev. 2013, 42, 8416.
Cui, Yi et al., "Organoboron Compounds with an 8-Hydroxyquinolato Chelate and Its Derivatives: Substituent Effects on Structures and Luminescence" Inorg. Chem., 2005, vol. 44, No. 3, 601-609.
Farfan, Norberto et al., "Through-bond Modulation of N+B Ring Formation shown by NMR and X-Ray Diffraction Studies of Borate Derivatives of Pyridyl Alcohols," J. Chem. Soc., Perkin Trans 2, 1992, 527-532.
Zhang, Zuolun, et al., "Luminescent Boron-Contained Ladder-Type π-Conjugated Compounds," Inorg. Chem. 2009, 48, 7230-7236.
ISA/KR, International Search Report for In'tl Application No. PCT/KR2016/002375, dated Jul. 6, 2016, 3 pages.
Supplementary European Search Report for In'tl Application No. PCT/KR2016/002375, dated Sep. 20, 2018, 8 pages.
JP Office Action "Notice of reasons for refusal" Patent application No. Japanese Patent Application No. 2017-547554; 4 pages.
Elena Dimitrijevic and Mark S. Taylor "9-Hetero-10-boraanthracene-derived borinic acid catalysts for regioselective activation of polyols" Chem. Sci., 2013, 4, 3298 DOI: 10.1039/c3sc51172c; www.rsc.org/chemicalscience.
Seare A. Berhe et al. "Optoelectronic Tuning of Organoborylazadipyrromethenes via Effective Electronegativity at the Metalloid Center" Department of Chemistry, University of North Texas, dx.doi.org/10.1021/ic402596u | Inorg. Chem. 2014, 53, 2346-2348 © 2014 American Chemical Society.

(Continued)

*Primary Examiner* — Charanjit Aulakh
(74) *Attorney, Agent, or Firm* — Umberg Zipser LLP

(57) ABSTRACT

The present invention relates to a method for preparing a four-coordinated organic boron compound, and more specifically, to a method for preparing various and widespread four-coordinated organic boron compounds by directly using an aryl, heteroaryl, or vinyl-functional boronic acid, boroxine, or borate compound as a starting material and adding the compound to any bidentate N,O-ligand, O,O-ligand, or N,N-ligand.

8 Claims, No Drawings

(56) References Cited

OTHER PUBLICATIONS

Roland Koster et al Borverbindungen, XXXIX1 An der Alkenoxygruppe substituierte Alkenoxy(diorganyl)borane aus 2-Methylacrolein und Triorganylboranen Copyright © 1976 Wiley-VCH Verlag GmbH & Co. KGaA, Weinheim; https://doi.org/10.1002/jlac.197619760613.

More, Ankush B "Masking and Demasking Strategies for the BF2—BODIPYs as a Tool for BODIPY Fluorophores" J. Org. Chem. 2014, 79, 22, 10981-10987 DOI: 10.1021/jo502028g; Publication Date (Web): Nov. 12, 2014.

Gonzalo Duran Sampedro et al; "First Highly Efficient and Photostable E and C Derivatives of 4,4-Difluoro-4-bora-3a,4a-diaza-s-indacene (BODIPY) as Dye Lasers in the Liquid Phase, Thin Films, and Solid-State Rods," Chemistry—A European Journal, Feb. 24, 2014; 20(9)2646-2653. https://doi.org/10.1002/chem.201303579.

Matsuda et al., "Synthesis of Dibenzoheteropines of Group 13-16 Elements via Ring-Closing Metathesis," The Journal of Organic Chemistry, 2013; 78:3329-3335.

\* cited by examiner

METHOD FOR PREPARING FOUR-COORDINATED ORGANIC BORON COMPOUND

TECHNICAL FIELD

The present invention relates to a method for preparing a four-coordinated organic boron compound.

BACKGROUND ART

An organic light emitting diode (OLED) is a self-luminous device that emits light when current is applied. OLEDs have a response speed more than one thousand times faster than that of LCDs, and have a wide viewing angle. OLEDs do not require the backlight, color filter, etc., required by LCDs and can be implemented with a flexible display such as plastic, and thus have great advantages not only in performance but also in the cost of parts.

The emission principle of OLEDs may be briefly described as follows. The holes injected at the anode and the electrons injected at the cathode are reconnected in the light emitting layer to form excitons, and as the excitons return to a stable state, the emitted energy is converted into light, and thereby light is emitted. OLEDs are classified into fluorescence and phosphorescence types according to the principle of luminescence. As described in the emission principle of OLEDs, holes and electrons are reconnected to form excitons, and in particular, the excitons in a "singlet excited state" and those in a "triplet excited state" are present in a quantum mechanical ratio of 1:3. In fluorescent materials, energy is converted to light only in the "singlet excited state", while energy is consumed as heat in the "triplet excited state", and thus the maximum internal quantum efficiency is limited to 25% or less. However, in phosphorescent materials, as the "singlet excited state" becomes stable by undergoing the "triplet excited state", the energies in both states can be converted to light, thereby achieving an internal quantum efficiency of up to 100%. Such phosphorescence is possible due to molecular structural features. Typically, the energy conversion from the "singlet excited state" to the "triplet excited state" is made possible through a coordination structure in which a metal ion such as iron, ruthenium, iridium, platinum, etc., is inserted in a molecular structure and organic materials are connected in the neighboring area.

However, metals such as iron, ruthenium, iridium, platinum etc., are very expensive and relatively difficult to use.

Boron atoms are less toxic than other heavy metal atoms such as iron, ruthenium, iridium, platinum etc., are relatively easy to use, and have many advantages in biological use. Boron-containing compounds exhibit unique optical properties. They can efficiently emit light via strong quantum absorption at low temperatures and are being studied and developed for use in lasers, molecular probes, and phosphorescent materials.

In particular, since a four-coordinated organic boron compound having a rigid π-conjugated structure has strong luminescence and high carrier mobility, it can be applied to organic light emitting diodes (OLEDs), organic field transistors, photoreactive sensors, and optoelectronics including imaging materials. Various chelating ligands and boron moieties have been developed to construct electronic structures and molecular arrangements that are suitable for playing an important role in the photophysical and electrical properties of four-coordinated boron compounds. As a result of these efforts, many molecules exhibiting high performance as light-emitting materials have been developed (Four-coordinate organoboron compounds for organic light-emitting diodes, *Chem. Soc. Rev.* 2013, 42, 8416). Meanwhile, multidisciplinary research on novel organic luminescent dyes is underway for potential applications in plastic electronics and biomedicine. In particular, attempts have been made to surround the center of tetrahedral boron(III) with fluorescent dyes (Luminescent Materials: Locking p-Conjugated and Heterocyclic Ligands with Boron (III), *Angew. Chem. Int. Ed.* 2014, 53, 2290).

Conventionally, four-coordinated organic boron compounds were generally synthesized by adding a diarylborinic acid ($Ar_2B-OH$), a diarylborinic anhydride ($Ar_2B-O-BAr_2$), or a triarylborane ($Ar_3B$) to a two-coordinated N,O-ligand (Qingguo Wu et al., *Chem. Mater.* 2000, 12, 79-83; WO Publication WO 02/44184 A2; Yi Cui et al., *Inorg. Chem.*, 2005, 44, 601 to 609; Norberto Farfan et al., *J. Chem. Soc., Perkin Trans* 2, 1992, 527 to 532; Zuolun Zhang et al., *Inorg. Chem.* 2009, 48, 7230 to 7236).

However, in the case of the above three compounds, various derivatives are not commercially available, and thus these compounds are obtained by synthesis in the laboratory. Therefore, the synthesis of boron compounds with the required optical properties is very limited.

Specifically, 8-quinolinolato-bis(2-benzothienyl)borane is synthesized from 8-hydroxyquinoline by adding tris-(2-benzothienyl)borane. In particular, since tris-(2-benzothienyl) borane is not commercially available, it must be obtained experimentally from 2-benzothiophene by a two-step reaction. Additionally, both n-BuLi and $BBr_3$ are expensive and very dangerous reagents to handle.

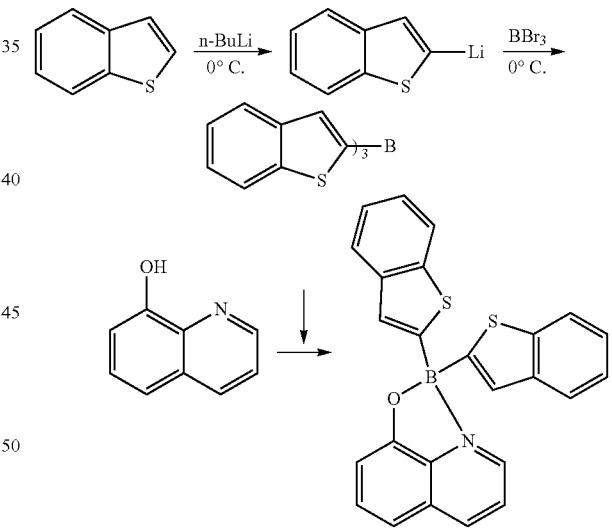

DISCLOSURE

Technical Problem

An object of the present invention is to provide a method for preparing a wide variety of four-coordinated organic boron compounds using readily available starting materials.

Technical Solution

A first aspect of the present invention provides a method for preparing a four-coordinated organic boron compound including step (1) of reacting a bidentate compound capable of coordination at a N or O position with an aryl, heteroaryl, or vinyl-functional boronic acid, boroxine, or borate compound in a solvent in the presence of a base, in which the amount of the solvent used in the reaction of step (1) is controlled to adjust the concentration of the bidentate compound to be 0.05 mol % or less.

A second aspect of the present invention provides a method for preparing a four-coordinated organic boron compound comprising step (1-1) of reacting a bidentate compound capable of coordination at a N or O position with a vinyl-functional boronic acid compound in a solvent in the presence of a base.

A third aspect of the present invention provides a four-coordinated organic boron compound represented by Formula 9, Formula 10, Formula 11, Formula 12, or Formula 13 below.

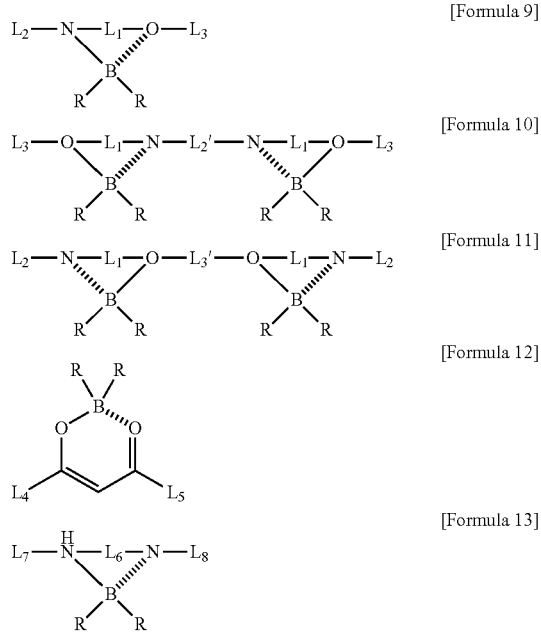

In the above formulas, $L_1$, being a bond between N and O separated by 1 to 5 carbon, nitrogen, oxygen, or sulfur atoms, represents a single bond, a double bond, or a combination thereof, and optionally, $L_1$ is substituted with amino, thio, phosphoryl, phosphinyl, carbonyl, silyl, boranyl, $C_{1-50}$ alkyl, $C_{2-50}$ alkenyl, $C_{2-50}$ alkynyl, oxo, $C_{1-50}$ alkoxy, $C_{3-50}$ cycloalkyl, $C_{6-50}$ aryl, heteroaryl or heterocycloalkyl having 5 to 50 atoms, or $C_{7-50}$ aralkyl unsubstituted or substituted with halogen, $C_{1-6}$ alkyl or $C_{6-10}$ aryl; or a part thereof;

$L_2$ is $C_{1-50}$ alkyl or $C_{6-50}$ arylallylidene; or forms heteroaryl or heterocycloalkyl having 5 to 50 atoms, unsubstituted or substituted with halogen or $C_{1-6}$ alkyl, along with an adjacent N atom, and optionally, a part or the entirety of $L_1$;

$L_2'$ forms heteroaryl or heterocycloalkyl having 5 to 50 atoms, unsubstituted or substituted with halogen or $C_{1-6}$ alkyl, along with two adjacent N atoms;

$L_3$ is hydrogen;

$L_3'$, being a bond between O and O separated by 1 to 5 carbon atoms, represents a single bond, a double bond, or a combination thereof;

$L_4$ and $L_5$ are each independently $C_{1-50}$ alkyl, $C_{6-50}$ aryl, $C_{4-50}$ heteroaryl, or $C_{7-50}$ aralkenyl, unsubstituted or substituted with $C_{1-4}$ haloalkyl, halogen, $C_{1-6}$ alkyl, $C_{1-6}$ alkoxy, hydroxy, or $C_{6-10}$ aryl; or each independently form $C_{5-10}$ cycloalkyl, unsubstituted or substituted with halogen, $C_{1-6}$ alkyl, oxo, carbonyl, $C_{1-6}$ alkoxy, hydroxy, or $C_{6-10}$ aryl, along with an adjacent aldehyde moiety;

$L_6$, being a bond between NH and N separated by 1 to 5 carbon, nitrogen, oxygen, or sulfur atoms, represents a single bond, a double bond, or a combination thereof;

$L_7$ forms heteroaryl or heterocycloalkyl having 5 to 50 atoms, unsubstituted or substituted with halogen or $C_{1-6}$ alkyl, along with the adjacent NH and a part of $L_6$; and $L_8$ is $C_{6-50}$ aryl, or forms heteroaryl or heterocycloalkyl having 5 to 50 atoms, unsubstituted or substituted with halogen or $C_{1-6}$ alkyl, along with the adjacent N atom and a part of $L_6$, and R is $C_{2-50}$ alkenyl, and optionally, is substituted with $C_{6-10}$ aryl or $C_{3-10}$ cycloalkyl.

Hereinafter, the present invention will be described in detail.

A four-coordinated organic boron compound has strong luminescence properties and can be useful for manufacturing organic light emitting diodes (OLEDs). A conventional method of preparing a four-coordinated organic boron compound is generally by adding a diarylborinic acid ($Ar_2B$—OH), a diarylborinic anhydride ($Ar_2B$—O—$BAr_2$), or a triarylborane ($Ar_3B$) to a two-coordinated N,O-ligand. However, a diarylborinic acid, a diarylborinic anhydride, and a triarylborane, which are used in the conventional preparation of the four-coordinated organic boron compound, are not commercially available. Therefore, it is necessary to directly prepare such compound for use by synthesis in the laboratory, and the catalyst material used in the laboratory synthesis is also expensive and difficult to handle. Accordingly, syntheses of boron compounds with the required optical properties are very limited, and mass production beyond the laboratory scale is difficult.

Unlike the conventional method for preparing a four-coordinated organic boron compound, in the present invention, it was discovered that a four-coordinated organic boron compound can be prepared by using boronic acid, boroxine, or borate compound, which are commercially available, and a 2-coordinated N,O-ligand, O,O-ligand, or N,N-ligand, i.e., a bidentate compound capable of coordination at a N or O position as a starting material, and reacting these compounds in a reaction solvent in the presence of a base, and in particular, it was discovered that a four-coordinated organic boron compound can be prepared in the presence of a cheap and easily available base without using an expensive catalyst in performing the reaction. Furthermore, in performing the reaction in the present invention, it was discovered that a four-coordinated organic boron compound can be prepared at a yield of 30% or higher by adjusting the amount of the solvent used in the reaction so that the concentration of the bidentate compound is 0.05 mol % or less. The present invention is based on the above discovery.

That is, the present invention provides a method for preparing a wide variety of four-coordinated organic boron compounds by directly using an aryl, heteroaryl, or vinyl-functional boronic acid, boroxine, or borate compound as a start material and adding the compound to any bidentate N,O-ligand, O,O-ligand, or N,N-ligand. The boronic acid, boroxine, or borate compound can be easily obtained in the form of a wide variety of derivatives and has an advantage in that they are very cheap. Additionally, the preparation method of the present invention is advantageous in that it is applicable to any bidentate N,O-ligand, O,O-ligand or N,N-ligand so that a wide variety of four-coordinated organic boron compounds can be prepared by the preparation method of the present invention. Accordingly, the method for preparing the four-coordinated organic boron compounds of the present invention can be very effectively used for the synthesis of the four-coordinated organic boron compounds for organic light emitting devices (OLEDs).

An aspect of the present invention provides a method for preparing a four-coordinated organic boron compound which can improve the yield of a four-coordinated organic boron compound by 30% or more, by adjusting the starting material in the reaction solution to be diluted below a certain level, by controlling the amount of the reaction solvent, preferably, by using a relatively large amount of the reaction solvent to a bidentate compound, which is used as a starting material, capable of coordination at a N or O position to be at a concentration of 0.05 mol % or less.

Preferably, the present invention provides a method for preparing a four-coordinated organic boron compound including step (1) of reacting a bidentate compound capable of coordination at a N or O position with an aryl, heteroaryl, or vinyl-functional boronic acid, boroxine, or borate compound in a solvent in the presence of a base, in which the amount of the solvent used in the reaction of step (1) is controlled to adjust the concentration of the bidentate compound to be 0.05 mol % or less.

Step (1) is a step of forming an organic boron compound, in which four-coordinated bonds are formed around boron, i.e., a four-coordinated organic boron compound, by reacting a bidentate compound capable of coordination at a N or O position with an aryl, heteroaryl, or vinyl-functional boronic acid, boroxine, or borate compound.

In the present invention, the yield of the four-coordinated organic boron compound to be prepared can be increased at least by 30% or more, preferably by 50% or more, and more preferably by 70% or more, by controlling the amount of the solvent used in the reaction of step (1) by adjusting the concentration of the bidentate compound to be 0.05 mol % or less.

Preferably, the amount of the solvent used in the reaction of step (1) may be controlled so that the concentration of the bidentate compound is in the range of 0.005 mol % to 0.05 mol %, and more preferably 0.02 mol % to 0.05 mol %.

As used herein, the term "ligand" refers to a molecule or ion that is bound in the vicinity of a central metal or nonmetal ion of a coordinating compound, and the term "ligand compound" refers to a compound that can be provided as such ligand. Additionally, as used herein, the term "bidentate compound" refers to a compound having two coordinate bonds that can be simultaneously formed with a central metal or nonmetal ion.

Since such a ligand compound can form a coordinate bond by providing a non-covalent electron pair to the central metal or nonmetal ion, it is essential to have a non-covalent electron pair so as to act as a ligand. The present invention is characterized by using a ligand compound having a nitrogen (N) or oxygen (O) atom as a donor atom that forms a coordinate bond by providing a non-covalent electron pair to the central metal or nonmetal ion. That is, as used herein, the term "bidentate compound capable of coordination at a N or O position" may refer to a ligand compound which has N or O as a donor atom and which is capable of bidentate coordination at a N or O position.

In a preferred embodiment, with regard to the method for preparing a four-coordinated organic boron compound of the present invention, the bidentate compound capable of coordination at a N or O position may be a compound which has an amine group or hydroxy group and capable of bidentate coordination at each of the N and O positions included in the amine group or hydroxy group.

In a preferred embodiment, with regard to the method for preparing a four-coordinated organic boron compound of the present invention, the bidentate compound capable of coordination at a N or O position may be a compound which has a diketone functional group and is capable of bidentate coordination at each of the O positions included in each ketone of the diketone functional group.

With regard to the method for preparing a four-coordinated organic boron compound of the present invention, the bidentate compound capable of coordination at a N or O position is a compound represented by Formula 1, Formula 2, Formula 3, Formula 4, or Formula 5 below.

[Formula 1]

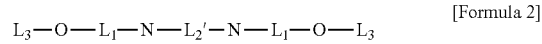

[Formula 2]

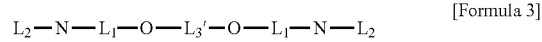

[Formula 3]

[Formula 4]

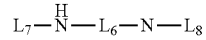

[Formula 5]

In the above formulas, $L_1$, being a bond between N and O separated by 1 to 5 carbon, nitrogen, oxygen, or sulfur atoms, represents a single bond, a double bond, or a combination thereof, and optionally, $L_1$ is substituted with amino, thio, phosphoryl, phosphinyl, carbonyl, silyl, boranyl, $C_{1-50}$ alkyl, $C_{2-50}$ alkenyl, $C_{2-50}$ alkynyl, oxo, $C_{1-50}$ alkoxy, $C_{3-50}$ cycloalkyl, $C_{6-50}$ aryl, heteroaryl or heterocycloalkyl having 5 to 50 atoms, or $C_{7-50}$ aralkyl unsubstituted or substituted with halogen, $C_{1-6}$ alkyl or $C_{6-10}$aryl; or a part thereof;

$L_2$ is $C_{1-50}$ alkyl or $C_{6-50}$ arylallylidene; or forms heteroaryl or heterocycloalkyl having 5 to 50 atoms, unsubstituted or substituted with halogen or $C_{1-6}$ alkyl, along with an adjacent N atom, and optionally, a part or the entirety of $L_1$;

$L_2'$ forms heteroaryl or heterocycloalkyl having 5 to 50 atoms, unsubstituted or substituted with halogen or $C_{1-6}$ alkyl, along with two adjacent N atoms;

$L_3$ is hydrogen;

$L_3'$, being a bond between O and O separated by 1 to 5 carbon atoms, represents a single bond, a double bond, or a combination thereof;

$L_4$ and $L_5$ are each independently $C_{1-50}$ alkyl, $C_{6-50}$ aryl, $C_{4-50}$ heteroaryl, or $C_{7-50}$ aralkenyl, unsubstituted or substituted with $C_{1-4}$ haloalkyl, halogen, $C_{1-6}$ alkyl, $C_{1-6}$ alkoxy, hydroxy, or $C_{6-10}$ aryl; or each independently form $C_{5-10}$ cycloalkyl, unsubstituted or substituted with halogen, $C_{1-6}$ alkyl, oxo, carbonyl, $C_{1-6}$ alkoxy, hydroxy, or $C_{6-10}$ aryl, along with an adjacent aldehyde moiety;

$L_6$, being a bond between NH and N separated by 1 to 5 carbon, nitrogen, oxygen, or sulfur atoms, represents a single bond, a double bond, or a combination thereof;

$L_7$ forms heteroaryl or heterocycloalkyl having 5 to 50 atoms, unsubstituted or substituted with halogen or $C_{1-6}$ alkyl, along with the adjacent NH and a part of $L_6$; and $L_8$ is $C_{6-50}$ aryl, or forms heteroaryl or heterocycloalkyl having 5 to 50 atoms, unsubstituted or substituted with halogen or $C_{1-6}$ alkyl, along with the adjacent N atom and a part of $L_6$.

Preferably, with regard to the method for preparing a four-coordinated organic boron compound of the present invention, $L_1$, being a bond between N and O separated by 1 to 3 carbon or nitrogen atoms, may represent a single bond, a double bond, or a combination thereof, and optionally, $L_1$ may be substituted with $C_{1-50}$ alkyl, oxo, $C_{6-50}$ aryl, or heteroaryl having 5 to 50 atoms, or $C_{7-50}$ aralkyl, unsubstituted or substituted with halogen or $C_{6-10}$ aryl; or a part thereof.

More preferably, with regard to the method for preparing a four-coordinated organic boron compound of the present invention, $L_1$, being a bond between N and O separated by 1 to 3 carbon or nitrogen atoms, may represent a single bond, a double bond, or a combination thereof, and optionally, $L_1$ may be substituted with methyl, oxo, phenyl, or pyrazolyl, unsubstituted or substituted with halogen or phenyl; or a part thereof.

Preferably, with regard to the method for preparing a four-coordinated organic boron compound of the present invention, $L_2$ may be $C_{o1-5}$ alkyl or $C_{6-50}$ arylallylidene; or may form heteroaryl or heterocycloalkyl having 5 to 50 atoms, along with an adjacent N atom, and optionally, a part or the entirety of $L_1$.

More preferably, with regard to the method for preparing a four-coordinated organic boron compound of the present invention, $L_2$ may be methyl or phenylallylidene; or may form quinoline, pyridine, imidazo[1,2-a]pyridine, pyrrolidine, benzoxazole, or benzothiazole, along with an adjacent N atom, and optionally, a part or the entirety of $L_1$.

Preferably, with regard to the method for preparing a four-coordinated organic boron compound of the present invention, $L_2'$ may form heteroaryl having 5 to 50 atoms along with two adjacent N atoms.

More preferably, with regard to the method for preparing a four-coordinated organic boron compound of the present invention, $L_2'$ may form thiazolo[5,4-d]thiazole along with two adjacent N atoms.

Preferably, with regard to the method for preparing a four-coordinated organic boron compound of the present invention, $L_3'$, being a bond between O and O separated by 1 to 2 carbon atoms, may represent a single bond, a double bond, or a combination thereof.

Preferably, with regard to the method for preparing a four-coordinated organic boron compound of the present invention, $L_4$ and $L_5$ each independently may be $C_{1-50}$ alkyl, $C_{6-50}$ aryl, or $C_{7-50}$ aralkenyl, unsubstituted or substituted with $C_{1-4}$ haloalkyl, halogen, $C_{1-6}$ alkoxy, or hydroxy; or each independently may form $C_{5-10}$ cycloalkyl, unsubstituted or substituted with halogen, $C_{1-6}$ alkyl, oxo, or $C_{6-10}$ aryl, along with an adjacent aldehyde moiety.

More preferably, with regard to the method for preparing a four-coordinated organic boron compound of the present invention, $L_4$ and $L_5$ each independently may be methyl, phenyl, phenylethenyl, or furanyl, unsubstituted or substituted with trifluoromethyl, fluoro, methoxy, or hydroxy; or each independently may form cyclohexyl or cyclopentyl, unsubstituted or substituted with methyl, oxo, or phenyl, along with an adjacent aldehyde moiety.

Preferably, with regard to the method for preparing a four-coordinated organic boron compound of the present invention, $L_6$, being a bond between NH and N separated by 1 to 2 carbon atoms, may represent a single bond, a double bond, or a combination thereof.

Preferably, with regard to the method for preparing a four-coordinated organic boron compound of the present invention, $L_7$ may form heteroaryl having 5 to 50 atoms, along with the adjacent NH and a part of $L_6$.

Preferably, with regard to the method for preparing a four-coordinated organic boron compound of the present invention, $L_8$ may be $C_{6-50}$ aryl or may form heteroaryl having 5 to 50 atoms, along with the adjacent N atom and a part of $L_6$.

Specifically, the bidentate compound capable of coordination at a N or O position may be a compound selected from the group consisting of:

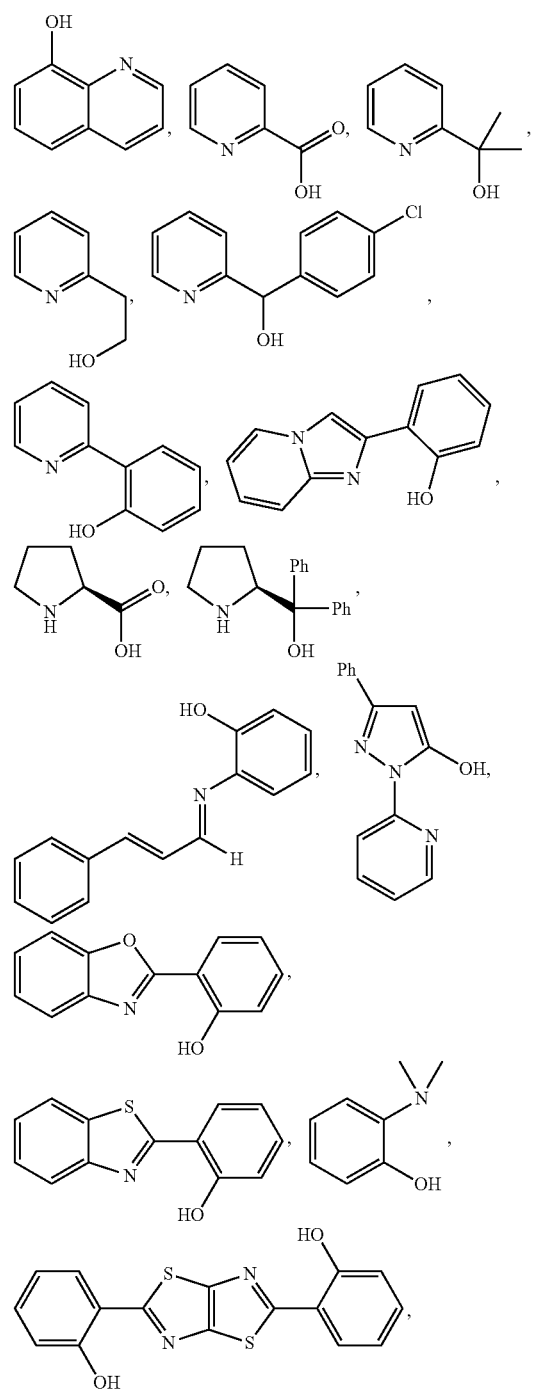

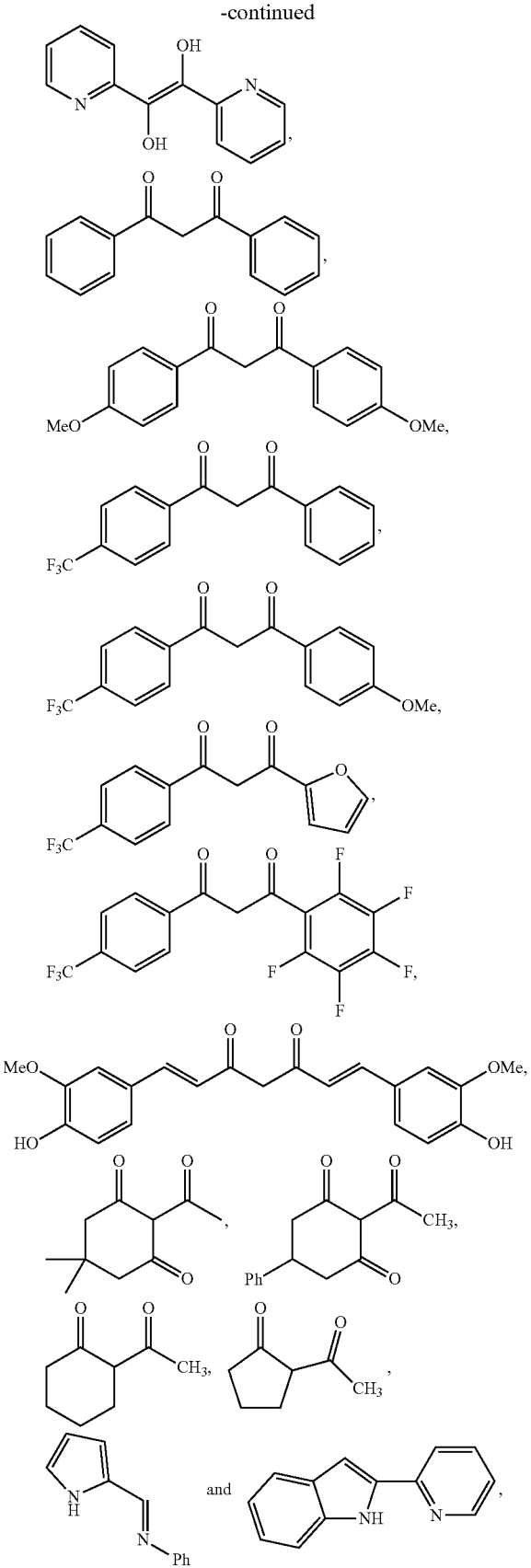

but is not limited thereto.

In the present invention, a boronic acid, boroxine, or borate compound which is readily commercially available is used as a starting material. In particular, the boronic acid, boroxine, or borate compound may be an aryl, heteroaryl, or vinyl-functional compound, i.e., a compound having an aryl, heteroaryl, or vinyl group as a functional group.

Since the aryl, heteroaryl, or vinyl-functional boronic acid, boroxine, or borate compound is used, in the case of reacting with a bidentate N,O-ligand, O,O-ligand, or N,N-ligand, two sites are coordinated by the N,O-ligand, O,O-ligand, or N,N-ligand, while simultaneously, two sites are coordinated by an aryl, heteroaryl, or vinyl group derived from a boronic acid, boroxine, or borate compound, and thereby a four-coordinated organic boron compound may be formed.

In a preferred embodiment of the present invention, the aryl, heteroaryl or vinyl-functional boronic acid, boroxine, or borate compound may be a compound represented by Formula 6, Formula 7, or Formula 8 below.

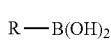

[Formula 6]

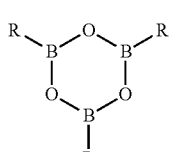

[Formula 7]

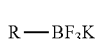

[Formula 8]

In the above formulas,

R may be $C_{6-50}$ aryl, $C_{2-50}$ alkenyl, or heteroaryl having 5 to 50 atoms; and optionally, may be substituted with halogen, $C_{1-6}$ alkoxy, $C_{1-6}$ alkyl, $C_{2-6}$ alkenyl, $C_{6-10}$ aryl, $C_{3-10}$ cycloalkyl, $C_{7-20}$ aralkyloxy, $C_{7-41}$ arylcarbonyl, unsubstituted or substituted amino, $C_{6-40}$ aryloxy, carbonyl, or cyano.

Preferably, R may be phenyl, naphthyl, ethenyl, pentenyl, benzo[d][1,3]dioxolyl, or benzo[b]thiophenyl, and optionally, may be substituted with halogen, methoxy, methyl, phenyl, cyclohexyl, ethenyl, benzyloxy, benzoyl, dimethylamino, phenoxy, carbonyl, or cyano.

Specifically, the aryl, heteroaryl, or vinyl-functional boronic acid, boroxine, or borate compound may be a compound selected from the group consisting of:

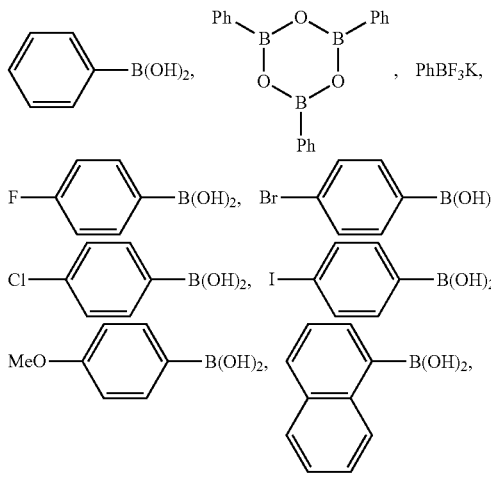

-continued

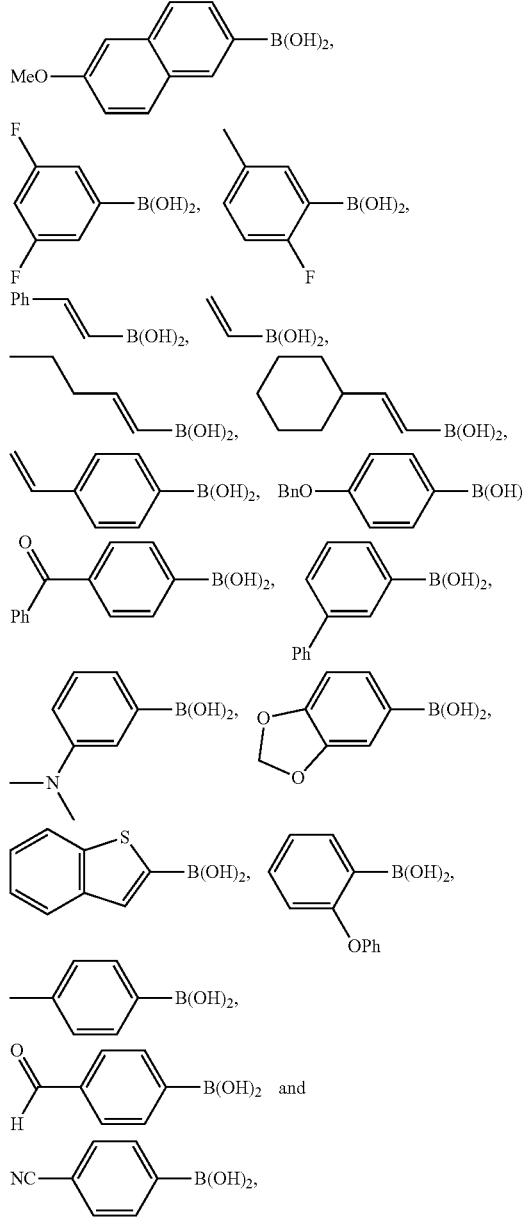

but is not limited thereto.

In a preferred embodiment, the four-coordinated organic boron compound that can be prepared by the method of the present invention as described above may be a compound represented by Formula 9, Formula 10, Formula 11, Formula 12, or Formula 13 below.

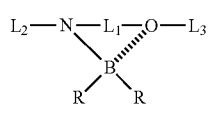
[Formula 9]

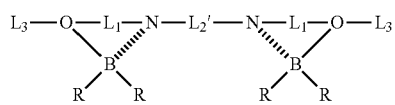
[Formula 10]

-continued

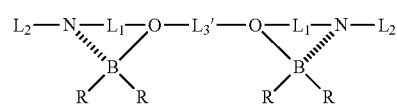
[Formula 11]

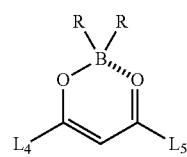
[Formula 12]

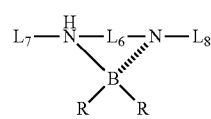
[Formula 13]

In the above formulas, $L_1$, $L_2$, $L_2'$, $L_3$, $L_3'$, $L_4$, $L_5$, $L_6$, $L_7$, and $L_8$ are the same as defined in Formula 1, Formula 2, Formula 3, Formula 4, or Formula 5, and R is the same as defined in Formula 6, Formula 7, or Formula 8.

Specifically, the four-coordinated organic boron compound may be a compound selected from the group consisting of:

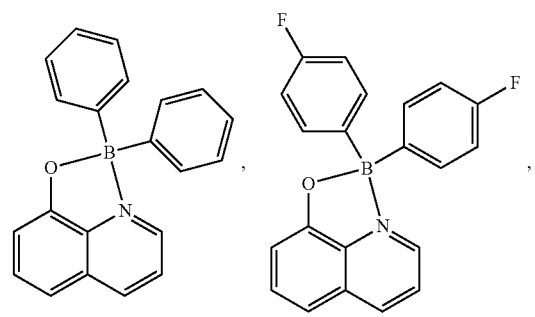

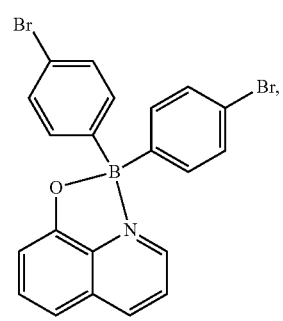

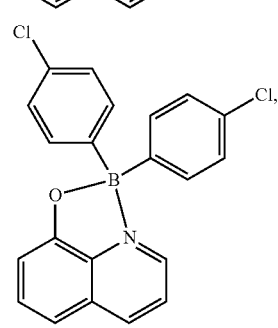

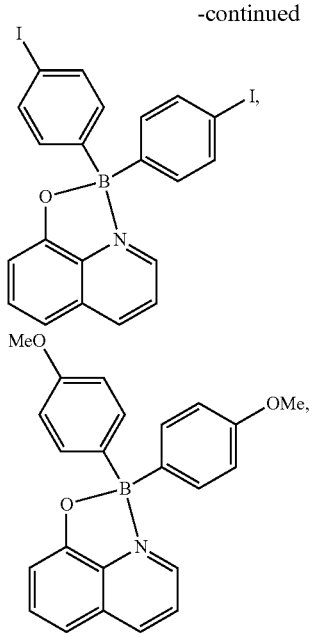
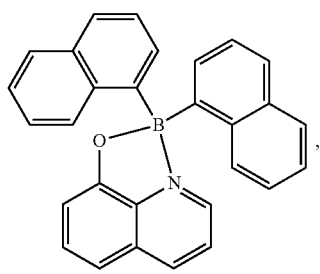
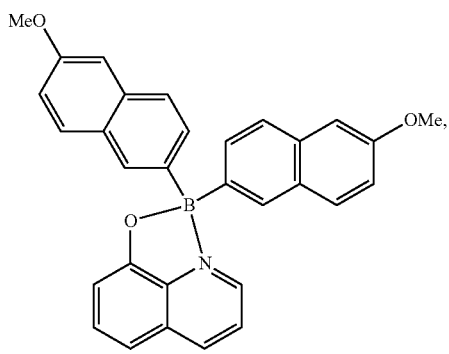
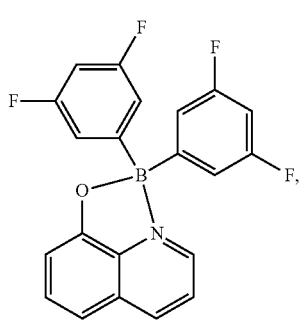
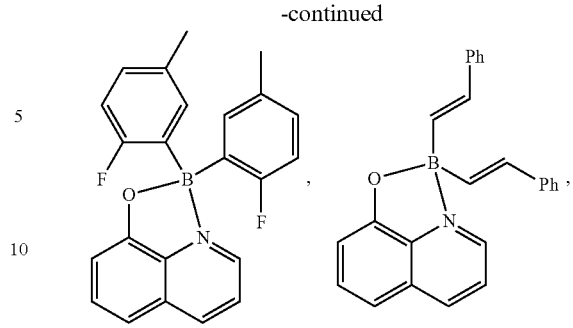
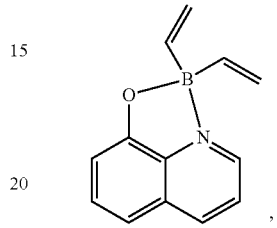
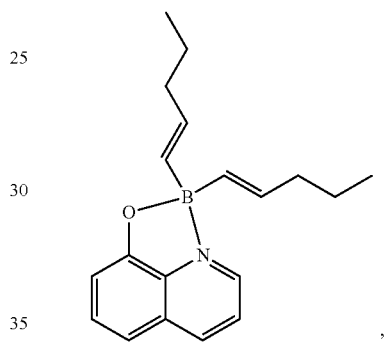
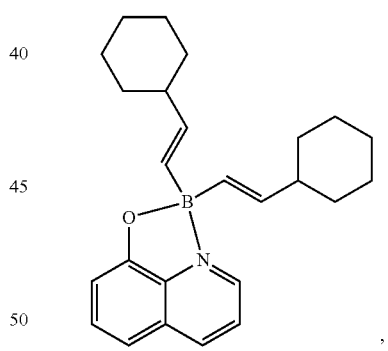
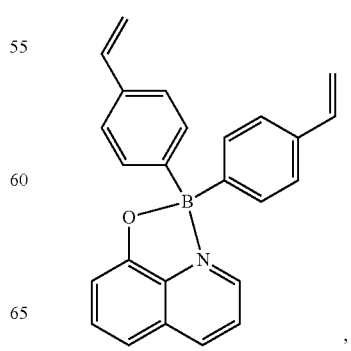

-continued
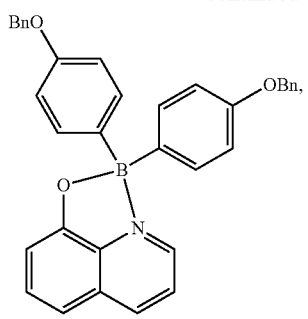
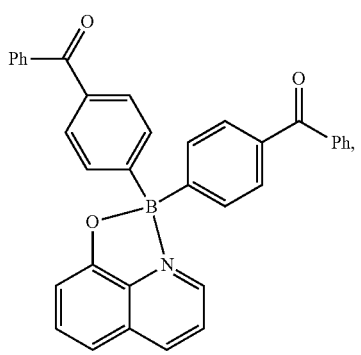
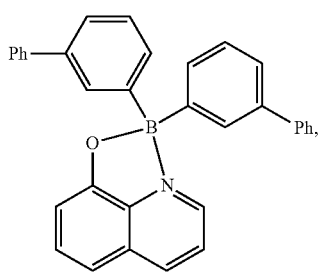
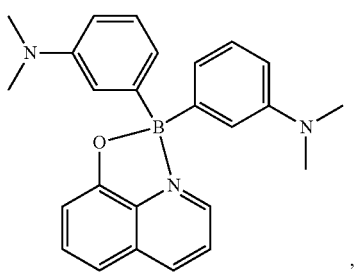
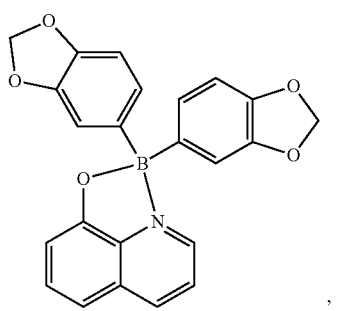
-continued
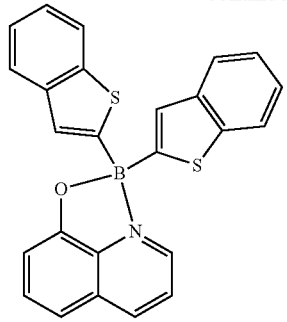
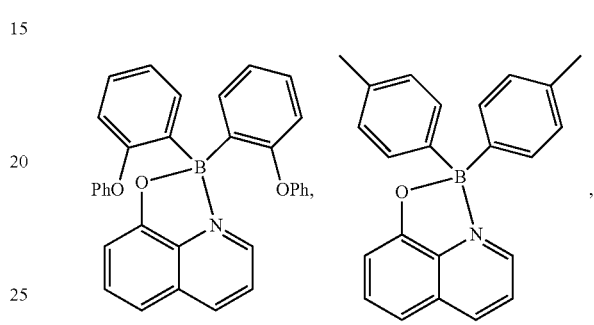
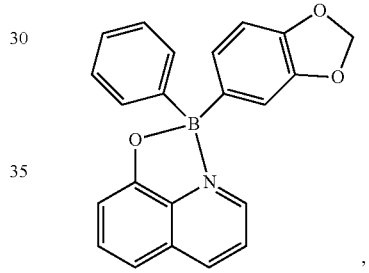
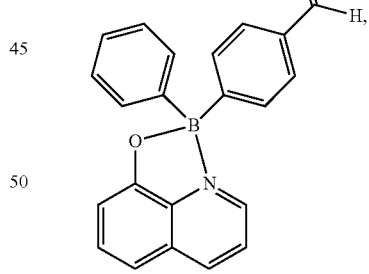
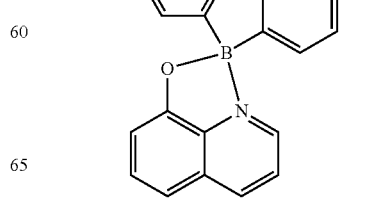

-continued
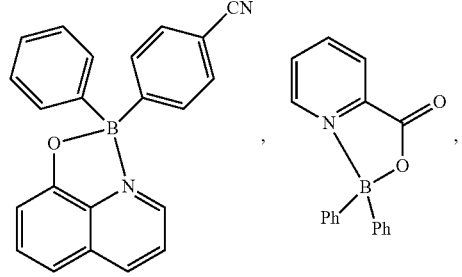
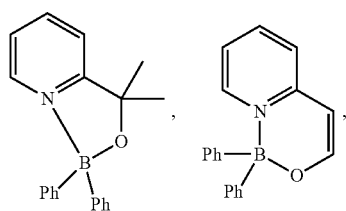
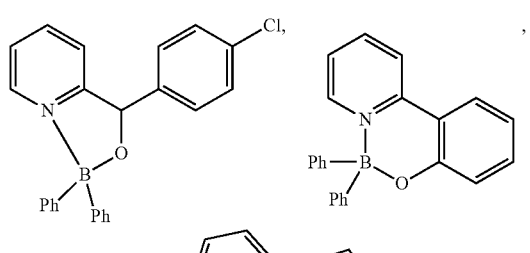
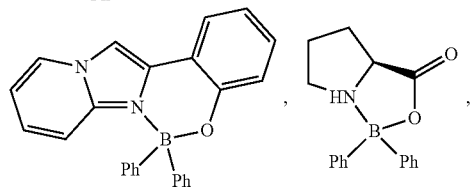
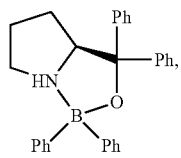
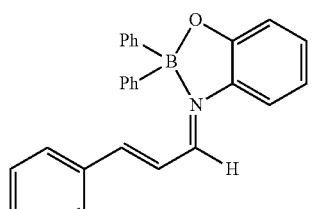
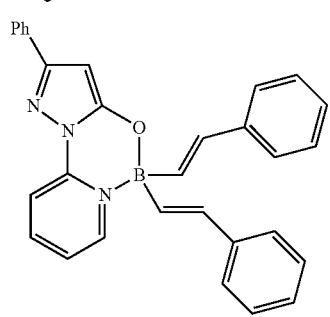
-continued
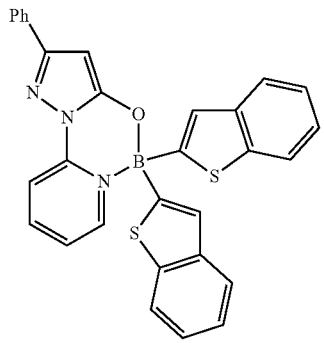
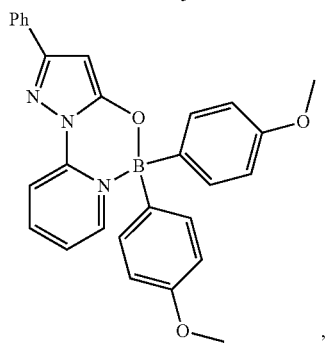
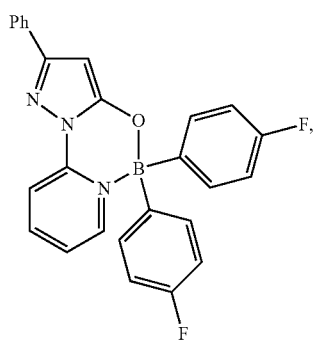
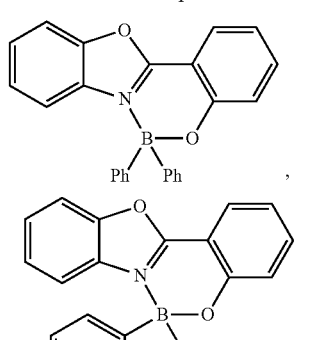
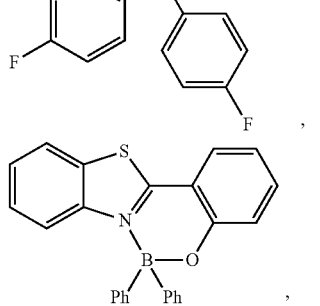

-continued
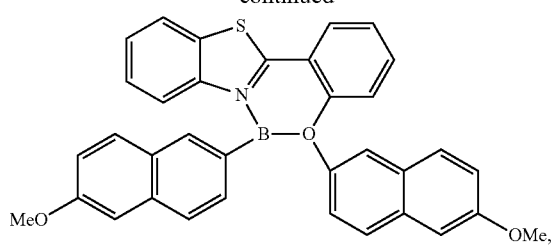
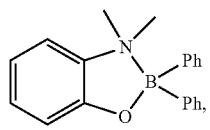
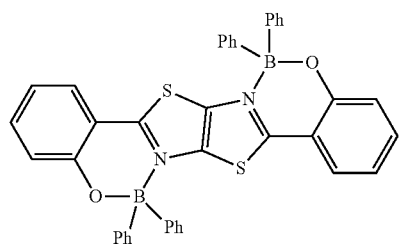
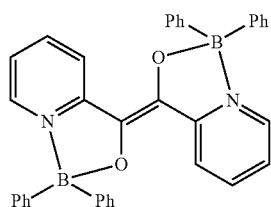
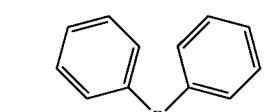
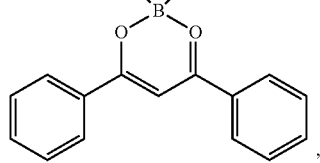
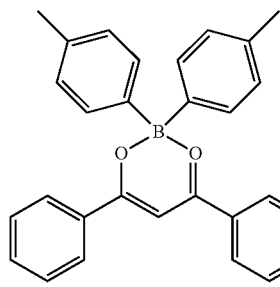
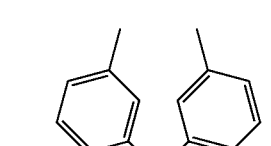
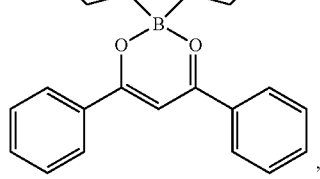
-continued
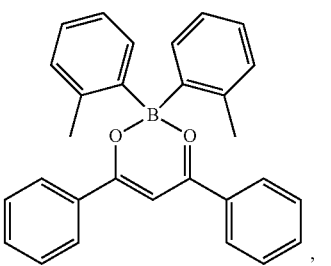
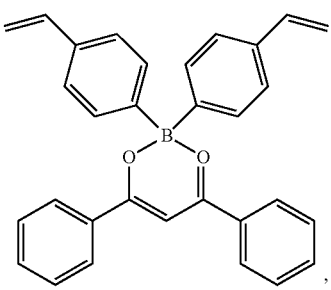
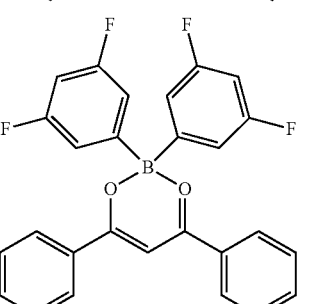
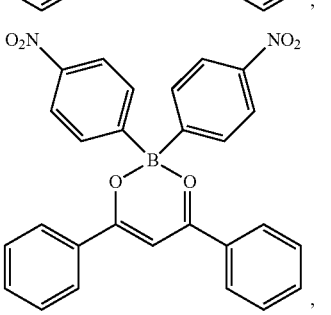
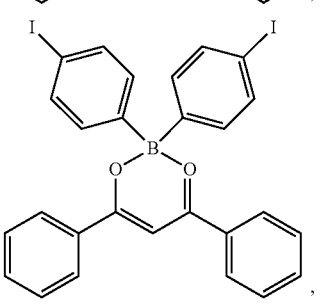
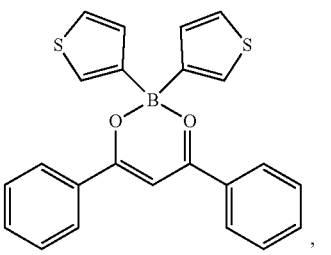

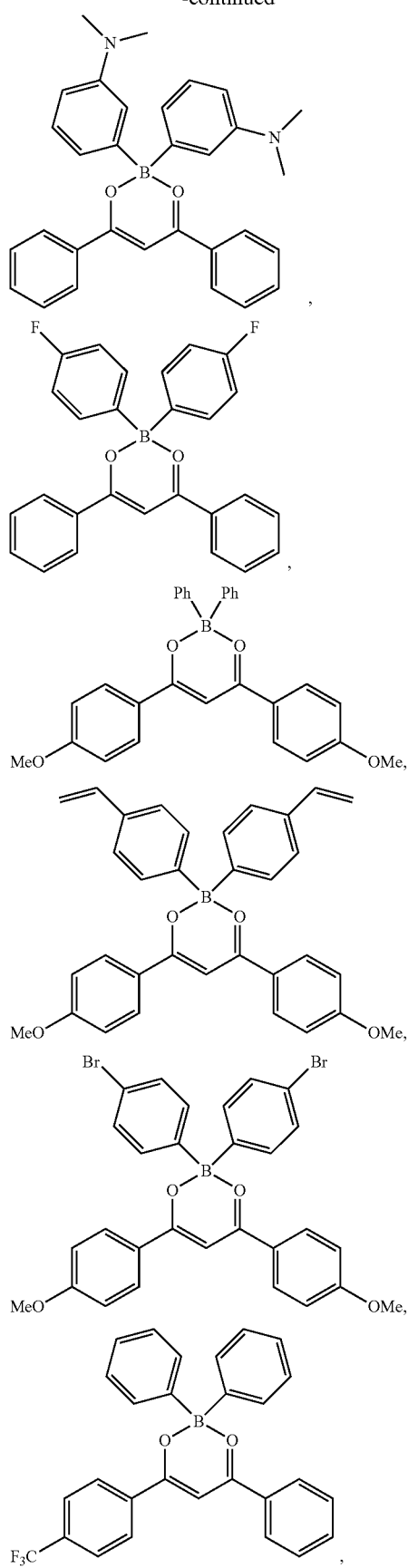
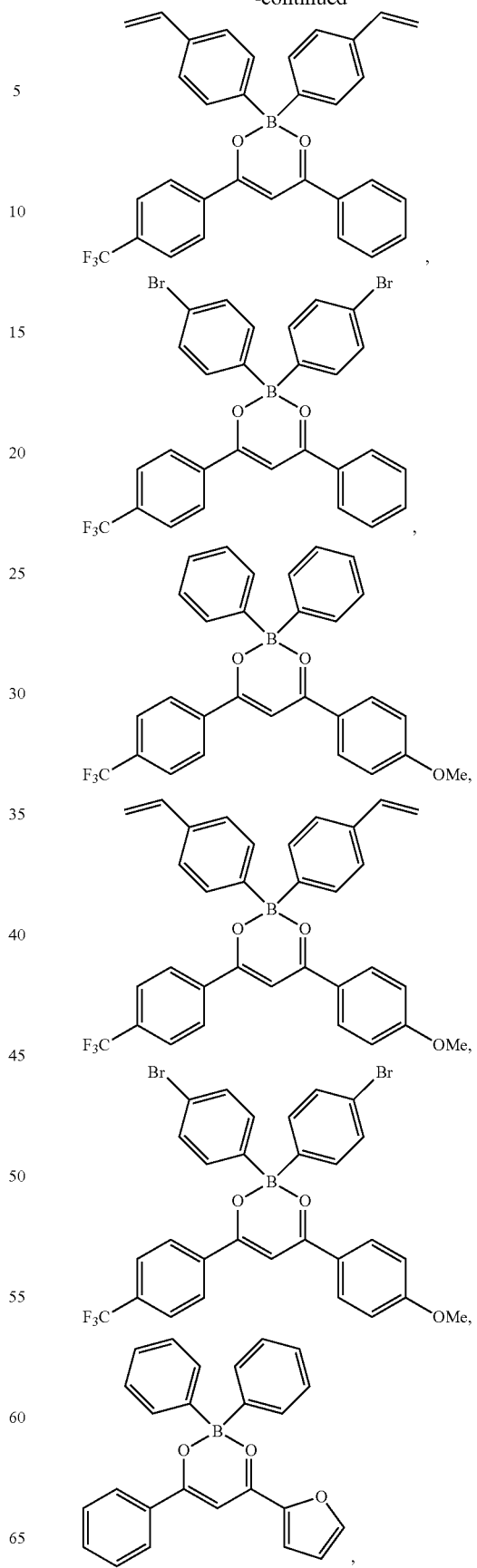

-continued

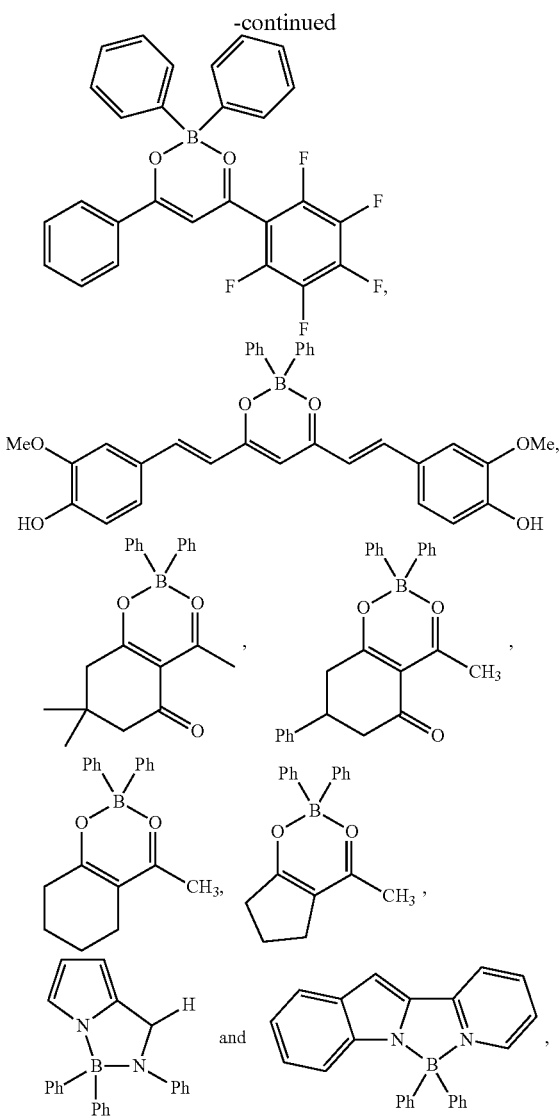

but is not limited thereto.

In the present invention, the solvent used in the reaction of step (1) may preferably be 1,4-dioxane, toluene, ethanol, dimethylformamide (DMF), or a mixed solvent thereof, and most preferably 1,4-dioxane.

In the present invention, the base used in the reaction of step (1) may preferably be $K_3PO_4$, $Cs_2CO_3$, KOH, triethylamine ($Et_3N$), N,N-diisopropylethylamine (i-$Pr_2NEt$), or a mixture thereof, and most preferably $K_3PO_4$.

Particularly preferably, in the present invention, the yield of the four-coordinated organic boron compound may be further increased when the reaction of step (1) is performed using 1,4-dioxane as a solvent in the presence of $K_3PO_4$ as a base (Examples 1-1 to 1-10).

In the present invention, the reaction of step (1) may be performed at 60° C. to 120° C., and preferably at 80° C. to 100° C. When the temperature is lower than 60° C., there is a disadvantage in that the reaction rate becomes slow and the reaction time becomes longer. Meanwhile, when the reaction temperature is higher than 120° C., there is a disadvantage in that impurities are generated, and as a result the yield is lowered.

In the present invention, the reaction time of step (1) may be in the range of 12 hours to 24 hours, and preferably 16 hours to 20 hours. When the reaction time is shorter than 12 hours, there is a disadvantage in that the reaction is not completed, and thus the starting material remains. Conventionally, the reaction is completed within 24 hours, and thus a reaction time of more than 24 hours is not necessary.

Additionally, in another aspect, the present invention provides a method for preparing a four-coordinated organic boron compound in which at least one ligand has a vinyl group by adding a boronic acid compound having a vinyl group as a functional group to a bidentate compound capable of coordination at a N or O position.

Preferably, the present invention provides a method for preparing a four-coordinated organic boron compound which includes step (1-1) of reacting a bidentate compound capable of coordination at a N or O position with a vinyl-functional boronic acid compound in a solvent in the presence of a base.

Step (1-1) is a step in which four coordinate bonds are formed centering on boron by reacting a bidentate compound capable of coordination at a N or O position with a vinyl-functional boronic acid compound, and in particular, at least one of the four coordinate bonds of a four-coordinated organic boron compound is coordinated with the vinyl group.

In the present invention, the vinyl-functional boronic acid compound used in step (1-1) may be a compound represented by Formula 6 below.

$$R\text{—}B(OH)_2 \quad \text{[Formula 6]}$$

In the above formula,

R may be $C_{2-50}$ alkenyl, and optionally, may be substituted with $C_{6-10}$ aryl or $C_{3-10}$ cycloalkyl.

Preferably, with regard to the vinyl-functional boronic acid compound used in step (1-1), R may be ethenyl or pentenyl, and optionally, may be substituted with phenyl or cyclohexyl.

In the present invention, the solvent used in the reaction of step (1-1) may be 1,4-dioxane, toluene, ethanol, dimethylformamide (DMF), or a mixed solvent thereof, and most preferably 1,4-dioxane.

In the present invention, the base used in the reaction of step (1-1) may be $K_3PO_4$, $Cs_2CO_3$, KOH, triethylamine ($Et_3N$), N,N-diisopropylethylamine (i-$Pr_2NEt$), or a mixture thereof, and most preferably $K_3PO_4$.

In the present invention, the reaction of step (1-1) may be performed at 60° C. to 120° C., and preferably at 80° C. to 100° C. When the temperature is lower than 60° C., there is a disadvantage in that the reaction rate becomes slow and the reaction time becomes longer. Meanwhile, when the reaction temperature is higher than 120° C., there is a disadvantage in that impurities are generated, and as a result the yield is lowered.

In the present invention, the reaction time of step (1-1) may be in the range of 12 hours to 24 hours, and preferably 16 hours to 20 hours. When the reaction time is shorter than 12 hours, there is a disadvantage in that the reaction is not completed, and thus the starting material remains. Conventionally, the reaction is completed within 24 hours, and thus a reaction time of more than 24 hours is not necessary.

Additionally, the present invention provides, as a novel compound, a four-coordinated organic boron compound represented by Formula 9, Formula 10, Formula 11, Formula 12, or Formula 13.

[Formula 9]

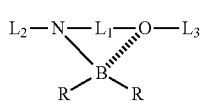

[Formula 10]

[Formula 11]

[Formula 12]

[Formula 13]

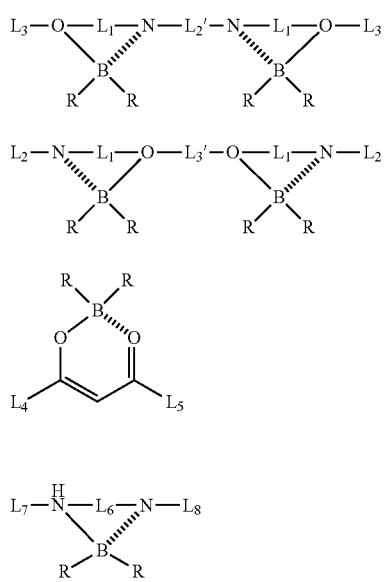

In the above formulas, $L_1$, $L_2$, $L_2'$, $L_3$, $L_3'$, $L_4$, $L_5$, $L_6$, $L_7$, and $L_8$ are the same as defined in Formula 1, Formula 2, Formula 3, Formula 4, or Formula 5; and R may be $C_{2-50}$ alkenyl, and optionally, may be substituted with $C_{6-10}$ aryl or $C_{3-10}$ cycloalkyl.

Preferably, R may be ethenyl or pentenyl, and optionally, may be substituted with phenyl or cyclohexyl.

Specifically, as a novel compound, the four-coordinated organic boron compound may be a compound selected from the group consisting of:

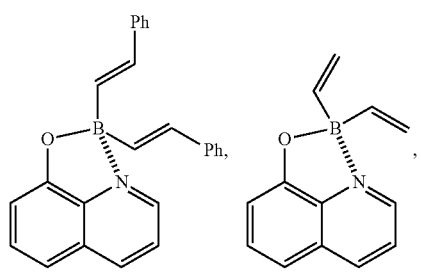

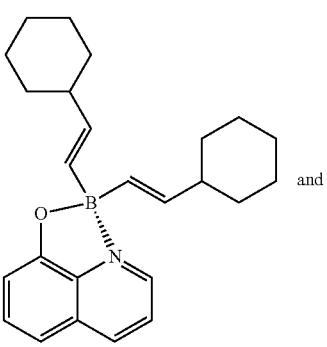

and

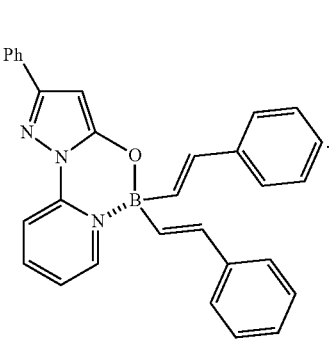

Advantageous Effects of the Invention

The present invention provides a method for preparing a wide variety of four-coordinated organic boron compounds by directly using an aryl, heteroaryl, or vinyl-functional boronic acid, boroxine, or borate compound as a start material and adding the compound to any bidentate N,O-ligand, O,O-ligand, or N,N-ligand. Furthermore, the method of the present invention is advantageous in that the yield of the four-coordinated organic boron compounds, i.e., the product, can be improved using an appropriate solvent and base. In particular, the method of the present invention is advantageous in that the yield of the four-coordinated organic boron compounds can be further improved by adjusting the concentration of the bidentate N,O-ligand, O,O-ligand, or N,N-ligand to be less than 0.05 mol %.

DETAILED DESCRIPTION OF THE INVENTION

Hereinafter, the present invention will be described in more detail with reference to the following Examples. However, these Examples are for illustrative purposes only and the invention is not intended to be limited by these Examples.

I. Synthesis of Diphenylborinic Acid 8-Hydroxyquinoline Ester

Diphenylborinic acid 8-hydroxyquinoline ester was synthesized according to the reaction scheme below.

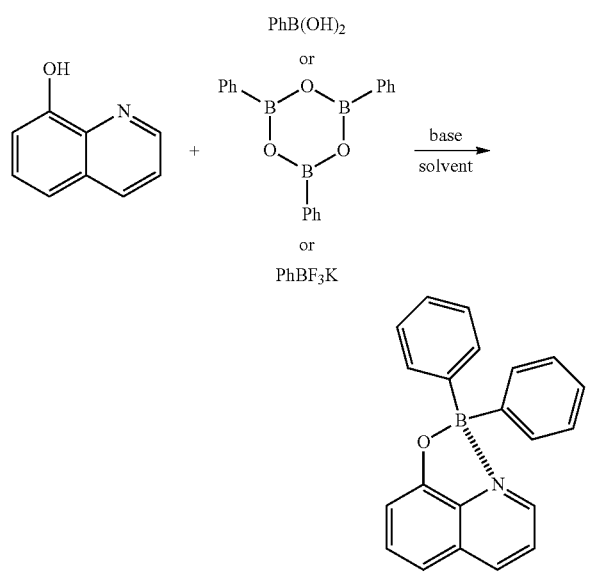

Example 1-1

Phenylboronic acid (1.1 g, 9.0 mmol) and $K_3PO_4$ (636.8 mg, 3.0 mmol) were each added to a solution of 8-hydroxyquinoline (145.1 mg, 1.0 mmol) in 1,4-dioxane (50 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (250 mg, 81%).

mp 205-207° C. (lit.[1] 205° C.); $^1$H NMR (300 MHz, $CDCl_3$): $\delta_H$ 8.58 (d, J=4.89 Hz, 1H), 8.40 (d, J=8.25 Hz, 1H), 7.68-7.60 (m, 2H), 7.30-7.22 (m, 7H), 7.18 (d, J=7.77 Hz, 1H) ppm; $^{13}$C NMR (125 MHz, $CDCl_3$): $\delta_C$ 158.8, 139.3, 138.7, 137.6, 132.9, 132.0, 128.5, 127.62, 127.0, 122.7, 112.2, 109.7 ppm; HRMS (EI) m/z [M+H]$^+$ calcd for $C_{21}H_{16}NOB$, 309.1325, found 309.1323.

Example 1-2

Phenylboronic acid (1.1 g, 9.0 mmol) and $Cs_2CO_3$ (977.6 mg, 3.0 mmol) were each added to a solution of 8-hydroxyquinoline (145.1 mg, 1.0 mmol) in 1,4-dioxane (50 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (73%).

Example 1-3

Phenylboronic acid (1.1 g, 9.0 mmol) and KOH (168.4 mg, 3.0 mmol) were each added to a solution of 8-hydroxyquinoline (145.1 mg, 1.0 mmol) in 1,4-dioxane (50 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (77%).

Example 1-4

Phenylboronic acid (1.1 g, 9.0 mmol) and $Cs_2CO_3$ (977.6 mg, 3.0 mmol) were each added to a solution of 8-hydroxyquinoline (145.1 mg, 1.0 mmol) in toluene (15 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (57%).

Example 1-5

Phenylboronic acid (1.1 g, 9.0 mmol) and $Cs_2CO_3$ (977.6 mg, 3.0 mmol) were each added to a solution of 8-hydroxyquinoline (145.1 mg, 1.0 mmol) in EtOH (15 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (48%).

Example 1-6

Phenylboronic acid (1.1 g, 9.0 mmol) and $Cs_2CO_3$ (977.6 mg, 3.0 mmol) were each added to a solution of 8-hydroxyquinoline (145.1 mg, 1.0 mmol) in DMF (15 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (58%).

Example 1-7

Phenylboronic acid (1.1 g, 9.0 mmol) and $K_3PO_4$ (636.8 mg, 3.0 mmol) were each added to a solution of 8-hydroxyquinoline (145.1 mg, 1.0 mmol) in 1,4-dioxane (15 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (67%).

Example 1-8

Phenylboronic acid (1.1 g, 9.0 mmol) and $Cs_2CO_3$ (977.6 mg, 3.0 mmol) were each added to a solution of 8-hydroxyquinoline (145.1 mg, 1.0 mmol) in 1,4-dioxane (15 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (56%).

Example 1-9

Phenylboronic acid (1.1 g, 9.0 mmol) and $Et_3N$ (304 mg, 3.0 mmol) were each added to a solution of 8-hydroxyquinoline (145.1 mg, 1.0 mmol) in 1,4-dioxane (15 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (34%).

Example 1-10

Phenylboronic acid (1.1 g, 9.0 mmol) and i-$Pr_2NEt$ (387 mg, 3.0 mmol) were each added to a solution of 8-hydroxyquinoline (145.1 mg, 1.0 mmol) in 1,4-dioxane (15 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (34%).

Example 1-11

2,4,6-Triphenyl boroxine (935 mg, 3.0 mmol) and $Cs_2CO_3$ (977.6 mg, 3.0 mmol) were each added to a solution of 8-hydroxyquinoline (145.1 mg, 1.0 mmol) in 1,4-dioxane (50 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (64%).

Example 1-12

Potassium phenyl trifluoroborate (1.65 g, 9.0 mmol) and $K_3PO_4$ (636.8 mg, 3.0 mmol) were each added to a solution of 8-hydroxyquinoline (145.1 mg, 1.0 mmol) in 1,4-dioxane (50 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol to obtain the target compound (16%).

II. Synthesis of Diaryl- or Divinylborinic Acid 8-Hydroxyquinoline Ester Derivatives Diphenylborinic acid 8-hydroxyquinoline ester was synthesized according to the reaction scheme below.

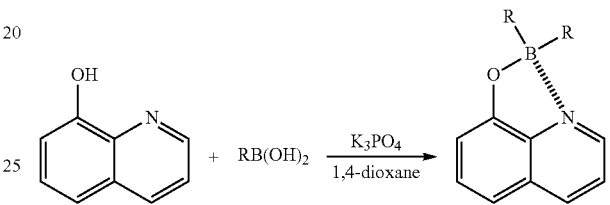

An arylboronic acid or vinylboronic acid (9.0 mmol) and $K_3PO_4$ (636.8 mg, 3.0 mmol) were each added to a solution of 8-hydroxyquinoline (145.1 mg, 1.0 mmol) in 1,4-dioxane (50 mL), and the resultant was heated to reflux for 16 hours to 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was recrystallized from ethanol or purified by column chromatography (15% to 20%, acetone in hexane) to obtain the target compound.

Example 2: Di-(4-fluorophenyl)borinic Acid 8-hydroxyquinoline Ester

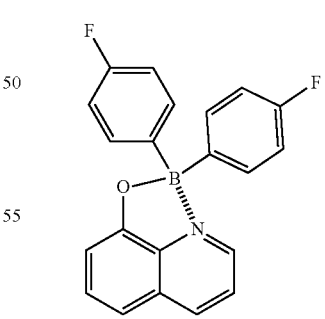

(269 mg, 78%); yellow solid; mp 168-170° C. (lit.[2] 166-167° C.); $^1$H NMR (300 MHz, $CDCl_3$): $\delta_H$ 8.51 (d, J=4.98 Hz, 1H), 8.44 (d, J=8.28 Hz, 1H), 7.70-7.62 (m, 2H), 7.36 (t, J=7.47 Hz, 4H), 7.27 (d, J=9.72 Hz, 1H), 7.18 (d, J=7.71 Hz, 1H), 6.95 (t, J=8.79 Hz, 4H) ppm; $^{13}$C NMR (125 MHz, $CDCl_3$): $\delta_C$ 163.54, 161.6, 158.5, 139.2, 139.1, 137.5, 133.7, 133.6, 133.1, 128.5, 122.9, 114.5, 114.36, 112.5, 109.9; HRMS (EI) m/z [M+H]+ calcd for $C_{21}H_{14}F_2NOB$, 345.1137, found 345.1141.

Example 3: Di-(4-bromophenyl)borinic Acid 8-hydroxyquinoline Ester

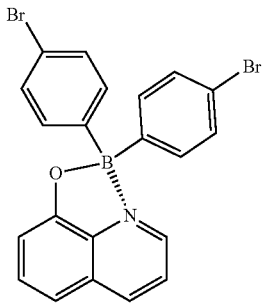

(327 mg, 70%); yellow solid; mp 200-201° C.; $^1$H NMR (300 MHz, CDCl$_3$): $\delta_H$ 8.50 (d, J=4.98 Hz, 1H), 8.45 (d, J=8.31 Hz, 1H), 7.71-7.63 (m, 2H), 7.38 (d, J=7.83 Hz, 4H), 7.29-7.25 (m, 5H), 7.18 (d, J=7.74 Hz, 1H) ppm; $^{13}$C NMR (125 MHz, CDCl$_3$): $\delta_C$ 158.4, 139.2, 139.2, 137.4, 133.7, 133.1, 130.8, 130.7, 130.6, 128.5, 122.9, 121.6, 112.7, 110.0; HRMS (EI) m/z [M+H]+ calcd for $C_{21}H_{14}Br_2NOB$, 464.9535, found 464.9552.

Example 4: Di-(4-chlorophenyl)borinic Acid 8-hydroxyquinoline Ester

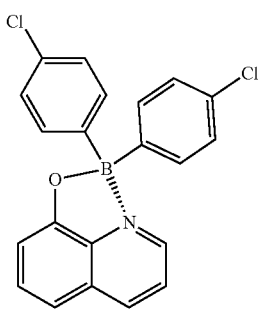

(284 mg, 75%); yellow solid; mp 191-193° C. (lit.[2] 192-194° C.); $^1$H NMR (500 MHz, CDCl$_3$): $\delta_H$ 8.59 (d, J=4.65 Hz, 1H), 8.40-8.38 (m, 1H), 7.68 (t, J=8.1 Hz, 1H), 7.61 (dd, J=4.95, 8.4 Hz, 1H), 7.40 (d, J=7.85 Hz, 4H), 7.25 (d, J=8.35 Hz, 1H), 7.19 (d, J=7.55 Hz, 1H), 7.14 (d, J=7.85 Hz, 4H) ppm; $^{13}$C NMR (125 MHz, CDCl$_3$): $\delta_C$ 158.4, 139.2, 137.5, 137.0, 133.4, 133.2, 133.1, 128.5, 127.8, 122.9, 112.7, 110.0 ppm; HRMS (EI) m/z [M+H]+ calcd for $C_{21}H_{14}Cl_2NOB$, 377.0545, found 377.0537.

Example 5: Di-(4-iodophenyl)borinic Acid 8-hydroxyquinoline Ester

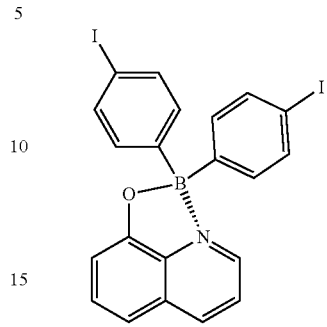

(477 mg, 85%); yellow solid; mp 189-192° C.; $^1$H NMR (300 MHz, CDCl$_3$): $\delta_H$ 8.48 (d, J=4.92 Hz, 1H), 8.43 (d, J=10.2 Hz, 1H), 7.69-7.57 (m, 6H), 7.26 (d, J=9.78 Hz, 1H), 7.18-7.12 (m, 5H) ppm; $^{13}$C NMR (125 MHz, CDCl$_3$): $\delta_C$ 158.4, 139.2, 139.1, 137.5, 136.7, 133.9, 133.1, 128.5, 122.9, 112.7, 110.0, 93.6 ppm; HRMS (EI) m/z [M+H]+ calcd for $C_{21}H_{14}NOBI_2$, 560.9258, found 560.9254.

Example 6: Di-(4-methoxyphenyl)borinic Acid 8-hydroxyquinoline Ester

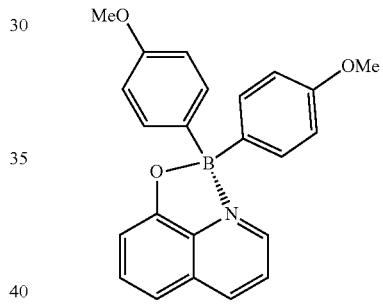

(140 mg, 38%); yellow solid; mp 228-229° C. (lit.[2] 222-224° C.); $^1$H NMR (300 MHz, CDCl$_3$): $\delta_H$ 8.52 (d, J=4.95 Hz, 1H), 8.40 (d, J=8.28 Hz, 1H), 7.67-7.57 (m, 2H), 7.36 (d, J=8.49 Hz, 4H), 7.23 (d, J=8.34 Hz, 1H), 7.15 (d, J=7.74 Hz, 1H), 6.83 (d, J=8.52 Hz, 4H), 3.76 (s, 6H) ppm; $^{13}$C NMR (125 MHz, CDCl$_3$): $\delta_C$ 153.7, 153.6, 133.9, 133.4, 132.3, 128.1, 127.7, 123.3, 117.6, 107.9, 106.8, 104.5, 49.8 ppm; HRMS (EI) m/z [M+H]+ calcd for $C_{23}H_{20}NO_3B$, 369.1536, found 369.1539.

Example 7: Di-(naphthalen-1-yl)borinic Acid 8-hydroxyquinoline Ester

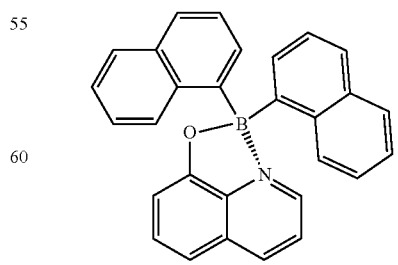

(61 mg, 38%); yellow solid; mp 178-179° C.; $^1$H NMR (300 MHz, CDCl$_3$): $\delta_H$ 8.62 (d, J=5.04 Hz, 1H), 8.41 (d, J=8.16 Hz, 1H), 8.28, (d, J=8.52 Hz, 2H), 7.77 (m, 5H), 7.58 (dd, J=5.04, 8.31 Hz, 1H), 7.37-7.13 (m, 10H) ppm; $^{13}$C NMR (125 MHz, CDCl$_3$): $\delta_C$ 158.4, 140.7, 138.9, 137.6, 136.3, 134.1, 132.9, 129.3, 128.8, 128.7, 128.4, 127.7, 125.3, 125.0, 124.8, 122.53, 112.4, 110.54 ppm; HRMS (EI) m/z [M+H]$^+$ calcd for C$_{29}$H$_{20}$NOB, 409.1638, found 409.1636.

Example 8: Di-(6-methoxynaphthalen-2-yl)borinic Acid 8-hydroxyquinoline Ester

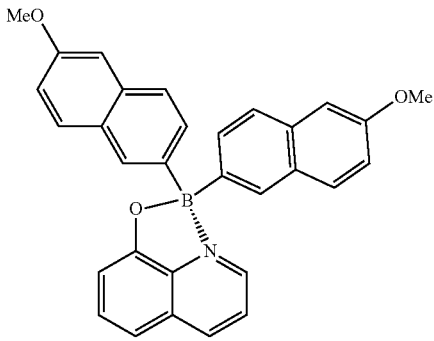

(399 mg, 85%); yellow solid; mp 249-250° C.; $^1$H NMR (300 MHz, CDCl$_3$): $\delta_H$ 8.65 (d, J=4.95 Hz, 1H), 8.43 (d, J=8.25 Hz, 1H), 7.83 (s, 2H), 7.72-7.55 (m, 8H), 7.29-7.23 (m, 2H), 7.09-7.03 (m, 4H), 3.9 (s, 6H) ppm; $^{13}$C NMR (125 MHz, CDCl$_3$): $\delta_C$ 153.6, 152.1, 134.2, 133.6, 132.5, 128.8, 127.8, 125.9, 125.6, 124.4, 123.7, 123.3, 120.7, 117.6, 112.8, 107.1, 104.7, 100.4, 50.1 ppm; HRMS (EI) m/z [M+H]$^+$ calcd for C$_{31}$H$_{24}$NO$_3$B, 469.1849, found 469.1847.

Example 9: Di-(3,5-difluoro)borinic Acid 8-hydroxyquinoline Ester

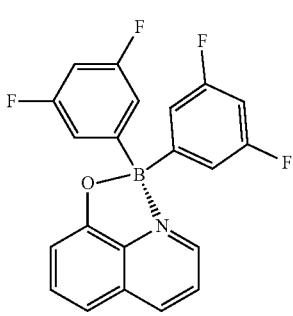

(267 mg, 70%); yellow solid; mp 191-192° C.; $^1$H NMR (300 MHz, CDCl$_3$): $\delta_H$ 8.55-8.49 (m, 2H), 7.74-7.68 (m, 2H), 7.32 (d, J=8.34 Hz, 1H), 7.22 (d, J=7.71 Hz, 1H), 6.89-6.86 (m, 4H), 6.69-6.61 (m, 2H) ppm; $^{13}$C NMR (125 MHz, CDCl$_3$): $\delta_C$ 164.0 (d, J=44.15 Hz), 162.0 (d, J=11.44 Hz), 139.8, 139.4, 137.3, 133.2, 128.5, 123.0, 113.9, 113.8, 113.7 (d, J=4.42 Hz), 113.2, 102.7, 102.5, 102.3 ppm; HRMS (EI) m/z [M+H]$^+$ calcd for C$_{21}$H$_{12}$F$_4$NOB, 381.0948, found 381.0948.

Example 10: Di-(2-fluoro-5-methylphenyl)borinic Acid 8-hydroxyquinoline Ester

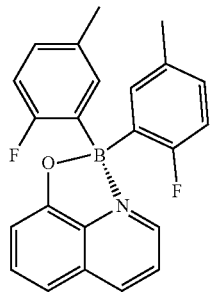

(299 mg, 80%); yellow solid; mp 179-180° C.; $^1$H NMR (300 MHz, CDCl$_3$): $\delta_H$ 8.92 (d, J=5.07 Hz, 1H), 8.40 (d, J=8.25 Hz, 1H), 7.65-7.56 (m, 2H), 7.31 (d, J=5.13 Hz, 2H), 7.23 (d, J=8.4 Hz, 1H), 7.18 (d, J=7.68 Hz, 1H), 7.03-6.98 (m, 2H), 6.78 (t, J=9.42 Hz, 2H), 2.26 (s, 6H) ppm; $^{13}$C NMR (125 MHz, CDCl$_3$): $\delta_C$ 165.2, 163.3, 141.4 (t, J=31.6 Hz), 138.9, 137.9, 135.3 (d, J=39.75 Hz), 132.7, 132.4, 129.6 (d, 32.25 Hz), 128.6, 122.8, 114.5, 114.3, 112.6, 109.5, 20.8 ppm; HRMS (EI) m/z [M+H]$^+$ calcd for C$_{23}$H$_{18}$NOBF$_2$, 373.1450, found 373.1444.

Example 11: Di-(E-styryl)borinic Acid 8-hydroxyquinoline Ester

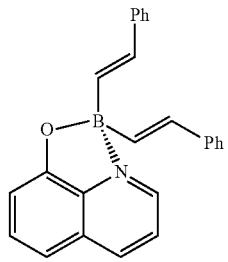

(285 mg, 79%); yellow solid; mp 144-146° C.; $^1$H NMR (300 MHz, CDCl$_3$): $\delta_H$ 8.49 (d, J=5.04 Hz, 1H), 8.40 (d, J=8.34 Hz, 1H), 7.67-7.62 (m, 2H), 7.43-7.40 (m, 4H), 7.28-7.22 (m, 5H), 7.16-7.13 (m, 3H), 6.75 (s, 4H) ppm; $^{13}$C NMR (125 MHz, CDCl$_3$): $\delta_C$ 158.8, 139.3, 138.9, 138.5, 137.4, 132.8, 128.6, 128.3, 126.9, 126.3, 122.7, 112.1, 109.7 ppm; HRMS (EI) m/z [M+H]$^+$ calcd for C$_{25}$H$_{20}$NOB, 361.1638, found 361.1633.

Example 12: Divinylborinic Acid 8-hydroxyquinoline Ester

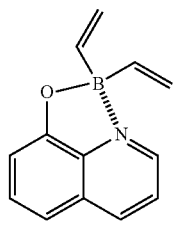

(55 mg, 26%); yellow oil; $^1$H NMR (300 MHz, CDCl$_3$): $\delta_H$ 8.39-8.35 (m, 2H), 7.64-7.58 (m, 2H), 7.20 (d, J=8.34 Hz, 1H), 7.07 (d, J=7.74 Hz, 1H), 6.31 (dd, J=13.22, 19.14 Hz, 2H), 5.52 (dd, J=3.0, 13.08 Hz, 2H), 5.35 (dd, J=3.78, 19.32 Hz, 2H) ppm; $^{13}$C NMR (125 MHz, CDCl$_3$): $\delta_C$ 153.5, 133.6, 133.2, 132.3, 127.6, 123.3, 117.3, 117.2, 106.7, 104.3 ppm; HRMS (EI) m/z [M+H]$^+$ calcd for C$_{13}$H$_{12}$NOB, 209.1012, found 209.1005.

Example 13: Di-(E-pent-1-en-1-yl)borinic Acid 8-hydroxyquinoline Ester

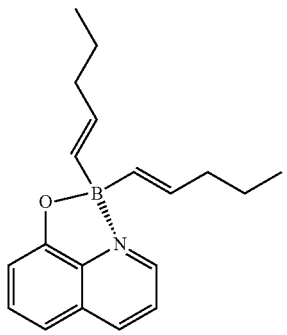

(117 mg, 40%); brown oil; $^1$H NMR (300 MHz, CDCl$_3$): $\delta_H$ 8.35-8.31 (m, 2H), 7.62-7.56 (m, 2H), 7.17 (d, J=8.28 Hz, 1H), 7.03 (d, J=7.71 Hz, 1H), 5.82-5.68 (m, 4H), 2.04-1.98 (m, 2H), 1.42-1.30 (m, 4H), 0.85 (t, 6H, J=7.32 Hz) ppm; $^{13}$C NMR (125 MHz, CDCl$_3$): $\delta_C$ 158.8, 138.7, 138.6, 137.9, 137.5, 132.6, 128.5, 122.4, 114.5, 109.3, 37.9, 22.4, 13.8 ppm; HRMS (EI) m/z [M+H]$^+$ calcd for C$_{19}$H$_{24}$NOB, 293.1951, found 293.1947.

Example 14: Di-(E-2-cyclohexylvinyl)borinic Acid 8-hydroxyquinoline Ester

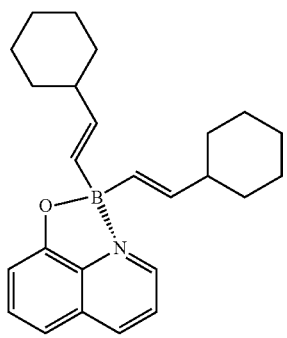

(179 mg, 48%); brown oil; $^1$H NMR (300 MHz, CDCl$_3$): $\delta_H$ 8.32-8.27 (m, 2H), 7.59-7.54 (m, 2H), 7.14 (d, J=8.34 Hz, 1H), 7.01 (d, J=7.71 Hz, 1H), 5.76-5.61 (m, 4H), 1.93-1.85 (m, 2H), 1.71-1.57 (m, 10H), 1.23-0.95 (m, 10H) ppm; $^{13}$C NMR (125 MHz, CDCl$_3$): $\delta_C$ 158.8, 144.6, 138.6, 137.9, 137.5, 132.6, 128.4, 122.4, 111.4, 109.2, 42.9, 33.0, 26.4, 26.3 ppm; HRMS (EI) m/z [M+H]$^+$ calcd for C$_{25}$H$_{32}$NOB, 373.2577, found 373.2567.

Example 15: Di-(4-vinylphenyl)borinic Acid 8-hydroxyquinoline Ester

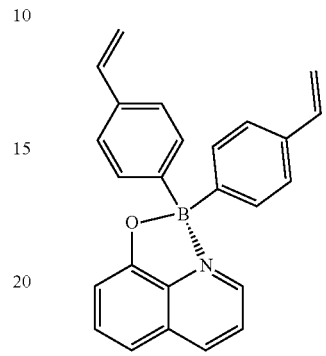

(238 mg, 66%); yellow solid; mp 197-198° C.; $^1$H NMR (300 MHz, CDCl$_3$): $\delta_H$ 8.56 (d, J=4.95 Hz, 1H), 8.40 (d, J=8.28 Hz, 1H), 7.68-7.59 (m, 2H), 7.40 (d, J=7.98 Hz, 4H), 7.32 (d, J=7.95 Hz, 4H), 7.24 (d, J=7.29 Hz, 1H), 7.17 (d, J=7.71 Hz, 1H), 6.68 (dd, J=10.86, 17.58 Hz, 2H), 5.69 (d, J=16.86 Hz, 2H), 5.16 (d, J=10.86 Hz, 2H) ppm; $^{13}$C NMR (125 MHz, CDCl$_3$): $\delta_C$ 158.72, 139.23, 138.80, 137.59, 137.24, 136.29, 132.97, 132.21, 128.47, 125.52, 122.77, 112.90, 112.26, 109.81 ppm; HRMS (EI) m/z [M+H]$^+$ calcd for C$_{25}$H$_{20}$NOB, 361.1638, found 361.1642.

Example 16: Di-(4-benzyloxyphenyl)borinic Acid 8-hydroxyquinoline Ester

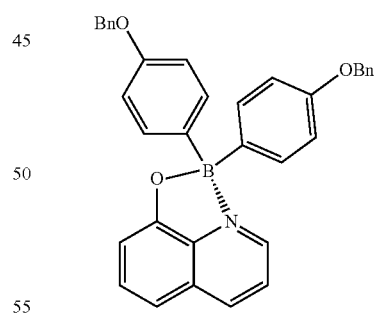

(375 mg, 66%); yellow solid; mp 115-116° C.; $^1$H NMR (300 MHz, CDCl$_3$): $\delta_H$ 8.52 (d, J=4.98 Hz, 1H), 8.38 (d, J=8.31 Hz, 1H), 7.67-7.57 (m, 2H), 7.39-7.26 (m, 14H), 7.22 (d, J=8.73 Hz, 1H), 7.15 (d, J=7.68 Hz, 1H), 6.90 (d, J=7.86 Hz, 4H), 5.02 (s, 4H) ppm; $^{13}$C NMR (125 MHz, CDCl$_3$): $\delta_C$ 158.77, 158.20, 139.20, 138.58, 137.54, 137.46, 133.35, 132.92, 128.56, 128.52, 128.48, 128.47, 128.45, 127.80, 127.54, 127.51, 127.47, 122.77, 114.09, 112.11, 109.66, 69.78 ppm; HRMS (EI) m/z [M+H]$^+$ calcd for C$_{35}$H$_{28}$NOB, 521.2162, found 521.2167.

Example 17: Di-(4-benzoylphenyl)borinic Acid 8-hydroxyquinoline Ester

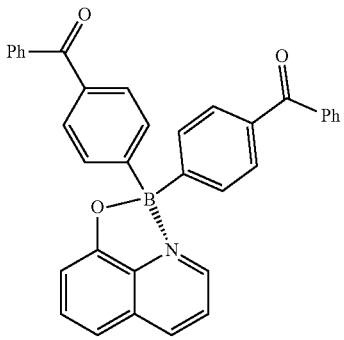

(274 mg, 53%); yellow solid; mp 160-161° C.; $^1$H NMR (300 MHz, CDCl$_3$): $\delta_H$ 8.64 (d, J=4.98 Hz, 1H), 8.49 (d, J=8.25 Hz, 1H), 7.80-7.77 (m, 4H), 7.74-7.69 (m, 6H), 7.58-7.52 (6H), 7.44 (t, J=7.68 Hz, 4H), 7.32 (d, J=8.34 Hz, 1H), 7.25 (d, J=7.25 Hz, 1H) ppm; $^{13}$C NMR (125 MHz, CDCl$_3$): $\delta_C$ 197.11, 158.38, 139.45, 137.93, 137.54, 136.39, 133.15, 132.18, 131.70, 130.06, 129.44, 128.56, 128.16, 123.0, 112.88, 110.16 ppm; HRMS (EI) m/z [M+H]$^+$ calcd for C$_{35}$H$_{24}$NO$_3$B, 517.1849, found 517.1842.

Example 18: Di-(1,1'-biphenyl-3-yl)borinic Acid 8-hydroxyquinoline Ester

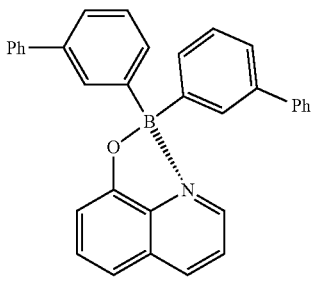

(222 mg, 48%); yellow solid; mp 82-83° C.; $^1$H NMR (300 MHz, CDCl$_3$): $\delta_H$ 8.66 (d, J=4.92 Hz, 1H), 8.41 (d, J=8.31 Hz, 1H), 7.72-7.60 (m, 4H), 7.54 (d, J=7.59 Hz, 4H), 7.49-7.46 (m, 4H), 7.38-7.34 (m, 6H), 7.29-7.20 (m, 4H) ppm; $^{13}$C NMR (125 MHz, CDCl$_3$): $\delta_C$ 158.76, 142.27, 140.33, 139.28, 138.87, 137.64, 132.99, 131.14, 130.85, 128.54, 128.50, 128.03, 127.35, 127.31, 126.77, 126.06, 122.83, 112.33, 109.92 ppm; HRMS (EI) m/z [M+H]$^+$ calcd for C$_{33}$H$_{24}$NOB, 461.1951, found 461.1953.

Example 19: Di-(3-dimethylaminophenyl)borinic Acid 8-hydroxyquinoline Ester

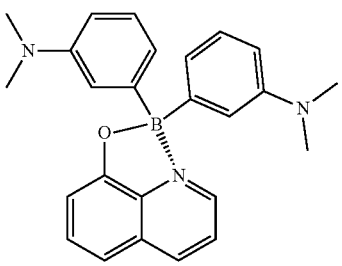

(162 mg, 41%); yellow solid; mp 149-150° C.; $^1$H NMR (300 MHz, CDCl$_3$): $\delta_H$ 8.60 (d, J=4.95 Hz, 1H), 8.35 (d, J=8.31 Hz, 1H), 7.65-7.54 (m, 2H), 7.21-7.12 (m, 4H), 7.0 (s, 2H), 6.79 (d, J=7.17 Hz, 2H), 6.64 (d, J=8.04 Hz, 2H), 2.85 (s, 12H) ppm; $^{13}$C NMR (125 MHz, CDCl$_3$): be 159.05, 150.23, 139.34, 138.45, 137.65, 132.76, 128.41, 128.20, 122.63, 120.87, 117.26, 111.95, 111.85, 109.54, 41.02 ppm; HRMS (EI) m/z [M+H]$^+$ calcd for C$_{25}$H$_{26}$N$_3$OB, 395.2169, found 395.2173.

Example 20: Di-(3,4-methylenedioxyphenyl)borinic Acid 8-hydroxyquinoline Ester

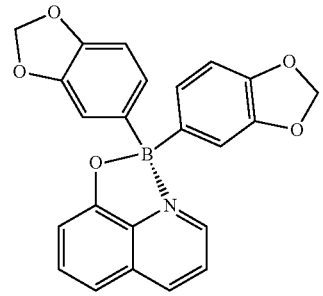

(238 mg, 53%); yellow solid; mp 174-175° C. (lit.[2] 174-176° C.); $^1$H NMR (300 MHz, CDCl$_3$): $\delta_H$ 8.51 (d, J=4.92 Hz, 1H), 8.41 (d, J=8.25 Hz, 1H), 7.69-7.60 (m, 2H), 7.24 (d, J=7.17 Hz, 1H), 7.16 (d, J=7.68 Hz, 1H), 6.89 (d, J=6.75 Hz, 4H), 6.75 (d, J=8.07 Hz, 2H), 5.86 (s, 4H) ppm; $^{13}$C NMR (125 MHz, CDCl$_3$): $\delta_C$ 158.48, 147.15, 146.66, 139.25, 138.82, 137.44, 132.97, 128.43, 125.32, 122.78, 112.33, 111.98, 109.83, 108.08, 100.23; HRMS (EI) m/z [M+H]$^+$ calcd for C$_{23}$H$_{16}$NO$_5$B, 397.1122, found 397.1122.

Example 21: Di-(benzo[b]thiophen-2-yl)borinic Acid 8-hydroxyquinoline Ester

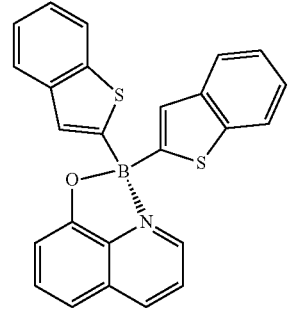

(320 mg, 76%); yellow solid; mp 204-206° C. (lit.[3] 204-206° C.); $^1$H NMR (300 MHz, CDCl$_3$): $\delta_H$ 8.71 (d, J=5.01 Hz, 1H), 8.47 (d, J=8.31 Hz, 1H), 7.79 (d, J=7.74 Hz, 2H), 7.74-7.66 (m, 4H), 7.50 (s, 2H), 7.34-7.22 (m, 6H) ppm; $^{13}$C NMR (125 MHz, CDCl$_3$): $\delta_C$ 157.95, 142.35, 141.36, 140.0, 139.58, 136.94, 133.10, 128.39, 127.19, 123.71, 123.47, 123.24, 122.95, 122.26, 113.24, 110.45; HRMS (EI) m/z [M+H]$^+$ calcd for C$_{25}$H$_{16}$NOS$_2$B, 421.0766, found 421.0758.

Example 22: Di-(2-phenoxyphenyl)borinic Acid 8-hydroxyquinoline Ester

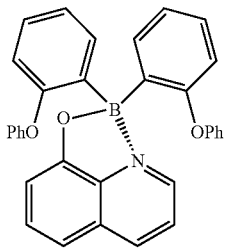

(281 mg, 57%); yellow solid; mp 174-175° C.; $^1$H NMR (300 MHz, CDCl$_3$): $\delta_H$ 8.94 (d, J=5.07 Hz, 1H), 8.04 (d, J=8.25 Hz, 1H), 7.72 (d, J=7.23 Hz, 2H), 7.46 (t, J=8.01 Hz, 1H), 7.18-7.02 (m, 10H), 6.95-6.86 (m, 3H), 6.71 (d, J=7.95 Hz, 2H), 6.50 (d, J=7.83 Hz, 4H) ppm; $^{13}$C NMR (125 MHz, CDCl$_3$): $\delta_C$ 159.4, 158.7, 157.3, 141.8, 198.1, 137.9, 135.9, 131.9, 129.1, 128.5, 128.1, 123.0, 122.1, 121.9, 118.1, 117.9, 111.9, 108.9 ppm; HRMS (EI) m/z [M+H]$^+$ calcd for C$_{33}$H$_{24}$NO$_3$B, 493.1849, found 493.1854.

Example 23: Di-(p-tolyl)borinic Acid 8-hydroxyquinoline Ester

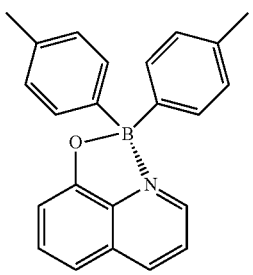

(293 mg, 87%); yellow solid; mp 195-196° C.; $^1$H NMR (500 MHz, CDCl$_3$): $\delta_H$ 8.58 (d, J=4.65 Hz, 1H), 8.39 (d, J=8.35 Hz, 1H), 7.68 (t, J=8.1 Hz, 1H), 7.61 (dd, J=4.95, 8.4 Hz, 1H), 7.39 (d, J=7.85 Hz, 4H), 7.25 (d, J=8.35 Hz, 1H), 7.19 (d, J=7.55 Hz, 1H), 7.14 (d, J=7.85 Hz, 4H) ppm; $^{13}$C NMR (125 MHz, CDCl$_3$): $\delta_C$ 158.9, 139.2, 138.6, 137.6, 136.4, 132.9, 132.1, 128.5, 128.4, 122.7, 112.1, 109.6, 21.3 ppm; HRMS (EI) m/z [M+H]$^+$ calcd for C$_{23}$H$_{20}$NOB, 337.1638, found 337.1633.

III. Synthesis of B,B'-diarylborinic Acid 8-hydroxyquinoline Ester Derivatives B,B'-Diarylborinic acid 8-hydroxyquinoline ester derivatives were synthesized according to the reaction scheme below.

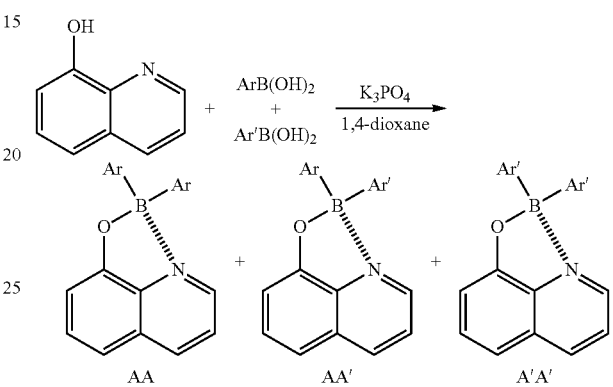

An arylboronic acid (4.5 mmol), an aryl'boronic acid (4.5 mmol), and K$_3$PO$_4$ (636.8 mg, 3.0 mmol) were each added to a solution of 8-hydroxyquinoline (145.1 mg, 1.0 mmol) in 1,4-dioxane (50 mL), and the resultant was heated to reflux for 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous Na$_2$SO$_4$ and concentrated under reduced pressure. The resulting solid residue was purified by column chromatography (20% to 25%, acetone in hexane) to obtain each of the compounds.

Specifically, the types of arylboronic acid and aryl'boronic acid used and the kind and yield of the B,B'-diarylborinic acid 8-hydroxyquinoline ester derivatives obtained are summarized in the following Table.

| entry | ArB(OH)$_2$ | Ar'B(OH)$_2$ | AA (yield) | AA' (yield) | A'A' (yield) |
|---|---|---|---|---|---|
| 1 | PhB(OH)$_2$ | benzo[d][1,3]dioxol-5-ylB(OH)$_2$ | 22% | 36% | 26% |
| 2 | PhB(OH)$_2$ | 4-OHC-C$_6$H$_4$-B(OH)$_2$ | 19% | 41% | 23% |
| 3 | PhB(OH)$_2$ | 4-NC-C$_6$H$_4$-B(OH)$_2$ | 12% | 48% | 18% |

Example 24: (3,4-Methylenedioxyphenyl)(phenyl)borinic Acid 8-hydroxyquinoline Ester

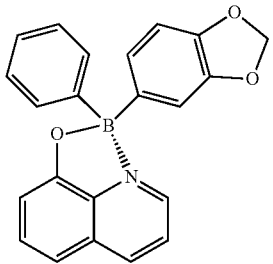

(127 mg, 36%); yellow solid; mp 172-173° C.; $^1$H NMR (500 MHz, CDCl$_3$): $\delta_H$ 8.57 (d, J=4.7 Hz, 1H), 8.41 (dd, J=0.85, 8.84 Hz, 1H), 7.68 (t, J=8.15 Hz, 1H), 7.63 (dd, J=5.0, 8.15 Hz, 1H), 7.51-7.49 (m, 2H), 7.33-7.30 (m, 2H), 7.28-7.25 (m, 2H), 7.20 (d, J=7.65 Hz, 1H), 6.94-6.92 (m, 2H), 6.79 (d, J=8.3 Hz, 1H), 5.89 (dd, J=1.6, 3.55 Hz, 2H) ppm; $^{13}$C NMR (125 MHz, CDCl$_3$): $\delta_C$ 158.7, 147.2, 146.7, 139.3, 138.8, 137.5, 132.9, 132.0, 128.4, 127.6, 127.0, 125.4, 122.8, 112.3, 112.0, 109.8, 108.1, 100.2 ppm; HRMS (EI) m/z [M+H]$^+$ calcd for C$_{22}$H$_{16}$NO$_3$B, 353.1223, found 353.1213.

Example 25-1: (4-Formylphenyl)(phenyl)borinic Acid 8-hydroxyquinoline Ester

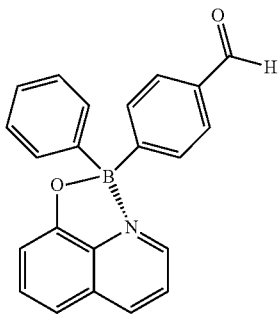

(138 mg, 41%); yellow solid; mp 158-159° C.; $^1$H NMR (300 MHz, CDCl$_3$): $\delta_H$ 9.96 (s, 1H), 8.60 (d, J=4.32 Hz, 1H), 8.45 (d, J=8.34 Hz, 1H), 8.25 (d, J=6.99 Hz, 2H), 7.77 (d, J=7.41 Hz, 2H), 7.72-7.58 (m, 3H), 7.51 (t, J=7.08 Hz, 2H), 7.40 (d, J=6.03 Hz, 2H), 7.29-7.20 (m, 2H) ppm; $^{13}$C NMR (125 MHz, CDCl$_3$): $\delta_C$ 192.9, 158.5, 139.3, 139.2, 135.6, 135.3, 133.1, 132.7, 132.4, 131.8, 128.9, 128.5, 128.0, 127.8, 127.3, 122.9, 112.6, 110.0 ppm; HRMS (EI) m/z [M+H]$^+$ calcd for C$_{22}$H$_{16}$NO$_2$B, 337.1274, found 337.1278.

Example 25-2: Di-(4-formylphenyl)borinic Acid 8-hydroxyquinoline Ester

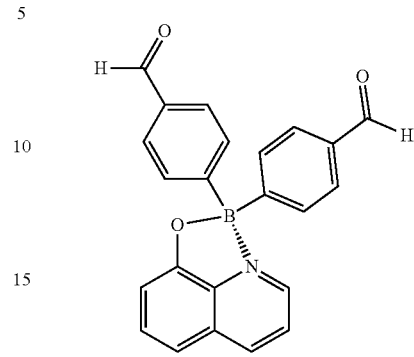

(84 mg, 23%); yellow oil; $^1$H NMR (300 MHz, CDCl$_3$): $\delta_H$ 9.97 (s, 2H), 8.62 (d, J=4.59 Hz, 1H), 8.50 (d, J=8.22 Hz, 1H), 7.78 (d, J=7.44 Hz, 4H), 7.72 (t, J=7.38 Hz, 2H), 7.59 (d, J=7.35 Hz, 4H), 7.33 (d, J=8.19 Hz, 1H), 7.25 (s, 1H) ppm; $^{13}$C NMR (125 MHz, CDCl$_3$): $\delta_C$ 192.8, 158.2, 139.7, 139.5, 137.4, 135.5, 133.2, 132.3, 129.1, 128.6, 123.1, 116.5, 113.1, 110.2 ppm; HRMS (EI) m/z [M+H]$^+$ calcd for C$_{23}$H$_{16}$NO$_3$B, 365.1223, found 365.1233.

Example 26: (4-Cyanophenyl)(phenyl)borinic Acid 8-hydroxyquinoline Ester

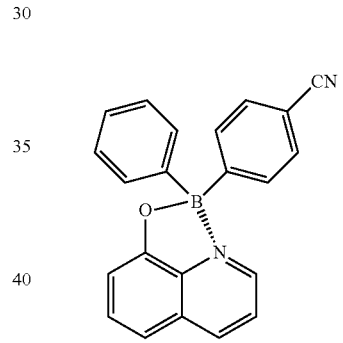

(160 mg, 48%); yellow solid; mp 153-154° C.; $^1$H NMR (300 MHz, CDCl$_3$): $\delta_H$ 8.59 (d, J=4.9 Hz, 1H), 8.49 (dd, J=0.6, 8.25 Hz, 1H), 7.74-7.69 (m, 2H), 7.59-7.55 (m, 4H), 7.40 (dd, J=1.55, 7.9 Hz, 2H), 7.33-7.28 (m, 5H), 7.23 (d, J=7.7 Hz, 1H) ppm; $^{13}$C NMR (125 MHz, CDCl$_3$): $\delta_C$ 158.4, 139.3, (d, J=22.2 Hz), 137.5, 133.1, 132.4, 131.8, 131.1, 128.5, 127.8, 127.4, 122.9, 119.7, 112.7, 110.5, 110.1 ppm; HRMS (EI) m/z [M+H]$^+$ calcd for C$_{22}$H$_{15}$N$_2$OB, 334.1277, found 334.1269.

IV. Synthesis of Four-Coordinated Organic Boron Compounds by Reaction Between Various Bidentate N,O-Ligands and Boronic Acid Four-coordinated organic boron compounds were synthesized according to the reaction scheme below.

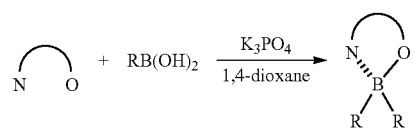

An arylboronic acid or vinylboronic acid (9.0 mmol) and $K_3PO_4$ (636.8 mg, 3.0 mmol) were each added to a solution of a selected bidentate N,O-ligand (1.0 mmol) in 1,4-dioxane (50 mL), and the resultant was heated to reflux for 16 hours to 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous $Na_2SO_4$ and concentrated under reduced pressure. The resulting solid residue was purified by column chromatography (15% to 35%, acetone in hexane) to obtain each of the compounds.

Example 27: Diphenylborinic Acid Picolinate

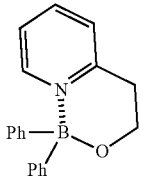

(98 mg, 34%); pale brown solid; mp 158-159° C.; $^1$H NMR (300 MHz, $CDCl_3$): $\delta_H$ 8.67 (d, J=5.52 Hz, 1H), 8.32 (d, J=4.05 Hz, 2H), 7.86 (q, J=5.31 Hz, 1H), 7.37-7.34 (m, 4H), 7.29-7.24 (m, 6H) ppm; $^{13}$C NMR (125 MHz, $CDCl_3$): $\delta_C$ 163.3, 143.4, 143.2, 141.8, 132.18, 128.9, 127.8, 127.6, 123.85 ppm; HRMS (EI) m/z [M+H]$^+$ calcd for $C_{18}H_{14}NO_2B$, 287.1118, found 287.1109.

Example 28:
2-(2-((Diphenylboryl)oxy)propan-2-yl)pyridine

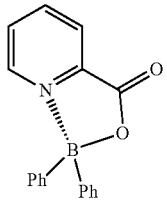

(151 mg, 50%); off-white solid; mp 212-213° C.; $^1$H NMR (300 MHz, $CDCl_3$): $\delta_H$ 8.39 (d, J=5.55 Hz, 1H), 8.06-8.01 (m, 1H), 7.49 (t, J=7.98 Hz, 2H), 7.94-7.36 (m, 4H), 7.23-7.15 (m, 6H), 1.63 (s, 6H) ppm; $^{13}$C NMR (125 MHz, $CDCl_3$): $\delta_C$ 165.8, 141.24, 140.8, 135.7, 132.5, 128.0, 127.2, 126.15, 123.9, 119.9, 80.6, 30.23 ppm; HRMS (EI) m/z [M+H]$^+$ calcd for $C_{20}H_{20}NOB$, 301.1638, found 301.1641.

Example 29:
2-(2-((Diphenylboryl)oxy)ethyl)pyridine

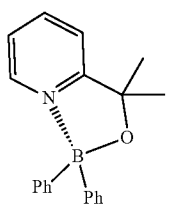

(172 mg, 60%); off-white solid; mp 163-164° C. (lit.$^4$ 162-169° C.); $^1$H NMR (300 MHz, $CDCl_3$): $\delta_H$ 8.21 (d, J=5.25 Hz, 1H), 7.89 (t, J=7.35 Hz, 1H), 7.42 (d, J=7.62 Hz, 1H), 7.32-7.19 (m, 11H), 4.10 (t, J=5.85 Hz, 2H), 3.18 (t, J=5.37 Hz, 2H) ppm; $^{13}$C NMR (125 MHz, $CDCl_3$): $\delta_C$ 157.90, 145.6, 139.8, 133.1, 127.2, 126.85, 126.2, 122.0, 57.8, 35.5 ppm; HRMS (EI) m/z [M+H]$^+$ calcd for $C_{19}H_{18}NOB$, 287.1481, found 287.1487.

Example 30: 2-((4-Chlorophenyl)((diphenylboryl)oxy)methyl)pyridine

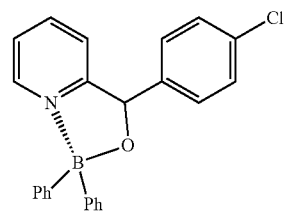

(172 mg, 60%); off-white solid; mp 138-140° C.; $^1$H NMR (300 MHz, $CDCl_3$): $\delta_H$ 8.46 (d, J=5.55 Hz, 1H), 7.71 (dd, J=1.26, 7.92 Hz, 1H), 7.54-7.49 (m, 5H), 7.40 (d, J=8.34 Hz, 4H), 7.32-7.20 (m, 7H), 6.1 (s, 1H) ppm; $^{13}$C NMR (125 MHz, $CDCl_3$): $\delta_C$ 161.0, 140.9 (d, J=19.50 Hz), 139.6, 134.4, 133.4, 132.1, 129.0 (d, J=23.30 Hz), 127.4 (d, J=39.0 Hz), 127.0, 126.3, 124.2, 121.20, 80.2 ppm; HRMS (EI) m/z [M+H]$^+$ calcd for $C_{24}H_{19}ClNOB$, 383.1248, found 383.1241.

Example 31:
2-(2-((Diphenylboryl)oxy)phenyl)pyridine

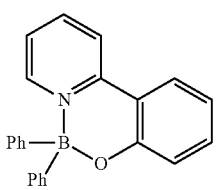

(292 mg, 87%); off-white solid; mp 203-204° C. (lit.$^5$ 200° C.); $^1$H NMR (300 MHz, $CDCl_3$): $\delta_H$ 8.13 (d, 1H, J=5.94 Hz), 8.03-7.93 (m, 2H), 7.62-7.59 (m, 1H), 7.39-7.29 (m, 2H), 7.25-7.14 (m, 11H), 6.82 (t, J=7.83 Hz, 1H) ppm; $^{13}$C NMR (125 MHz, $CDCl_3$): $\delta_C$ 160.1, 150.9, 144.1, 134.3, 133.3, 127.3, 126.5, 125.4, 121.7, 121.2, 120.7, 119.3, 118.4 ppm; HRMS (EI) m/z [M+H]$^+$ calcd for $C_{23}H_{18}NOB$, 335.1481, found 335.1471.

Example 32: 2-(2-((Diphenylboryl)oxy)phenyl)imidazo[1,2-a]pyridine

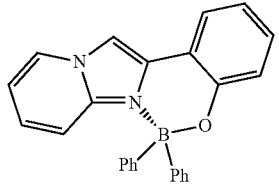

(333 mg, 89%); off-white solid; mp 283-285° C.; $^1$H NMR (300 MHz, CDCl$_3$): $\delta_H$ 8.08 (d, J=6.72 Hz, 1H), 7.61 (s, 1H), 7.34 (d, J=6.6 Hz, 5H), 7.22-7.14 (m, 9H), 6.98 (t, J=6.78 Hz, 1H), 6.88 (d, J=9.24 Hz, 1H), 6.71 (t, J=7.35 Hz, 1H) ppm; $^{13}$C NMR (125 MHz, CDCl$_3$): $\delta_C$ 158.2, 140.6, 137.8, 133.2, 131.8, 128.4, 127.3, 126.4, 126.1, 124.6, 120.6, 118.4, 115.1, 114.7, 114.2, 105.6 ppm; HRMS (EI) m/z [M+H]$^+$ calcd for C$_{25}$H$_{19}$N$_2$OB, 374.1590, found 374.1587.

Example 33: Diphenylborinic Acid (L)-proline Ester

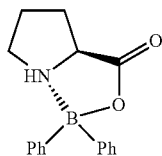

(148 mg, 53%); off-white solid; mp 272-273° C.; $^1$H NMR (300 MHz, DMSO-d$_6$): $\delta_H$ 7.91 (d, J=6.3 Hz, 1H), 7.48-7.41 (m, 4H), 7.26-7.12 (m, 6H), 4.26-4.19 (m, 1H), 3.04-2.94 (m, 1H), 2.49-2.35 (m, 1H), 2.04-1.96 (m, 2H), 1.78-1.77 (m, 2H) ppm; $^{13}$C NMR (125 MHz, DMSO-d$_6$): $\delta_C$ 175.1, 131.7, 131.4, 127.7, 127.6, 62.7, 50.6, 27.8, 25.3 ppm; HRMS (EI) m/z [M+H]$^+$ calcd for C$_{17}$H$_{18}$NO$_2$B, 279.1431, found 279.1440.

Example 34: (S)-2-(((Diphenylboryl)oxy)diphenylmethyl)pyrrolidine

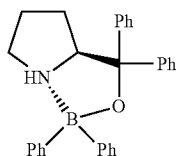

(309 mg, 74%); off-white solid; mp 198-199° C.; $^1$H NMR (500 MHz, DMSO-d$_6$): $\delta_H$ 7.74 (d, J=7.5 Hz, 2H), 7.59 (dd, J=1.0, 8.45 Hz, 2H), 7.54 (dd, J=0.85, 7.7 Hz, 2H), 7.31-7.28 (m, 4H), 7.20 (bs, 1H), 7.16-7.11 (m, 3H), 7.03 (t, J=7.25 Hz, 3H), 6.99-6.93 (m, 3H), 6.88 (t, J=7.25 Hz, 1H), 4.79 (q, J=8.35 Hz, 1H), 3.23-3.18 (m, 1H), 3.01-2.96 (m, 1H), 1.79-1.73 (m, 1H), 1.58-1.45 (m, 2H), 0.82-0.78 (m, 1H) ppm; $^{13}$C NMR (125 MHz, DMSO-d$_6$): $\delta_C$ 148.6 (d, J=40.9 Hz), 133.0, 131.6, 128.1, 127.6, 127.1, 127.0, 126.5, 126.3 (d, J=35.45 Hz), 125.6, 124.7, 84.1, 69.8, 48.6, 28.7, 23.2 ppm; HRMS (EI) m/z [M+H]$^+$ calcd for C$_{29}$H$_{28}$NOB, 417.2264, found 417.2225.

Example 35: E-2-(Diphenylboryloxy)-N-(E)-3-phenylallylidene)aniline

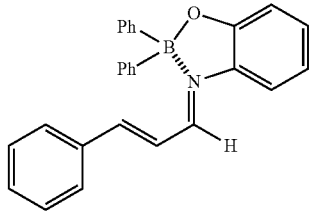

(325 mg, 84%); red solid; mp 239-241° C.; $^1$H NMR (300 MHz, CDCl$_3$): $\delta_H$ 8.42 (dd, J=4.11, 5.73 Hz, 1H), 7.46 (m, 4H), 7.40 (d, J=8.01 Hz, 1H), 7.36-7.16 (m, 14H), 7.05 (d, J=8.1 Hz, 1H), 6.85-6.80 (m, 1H) ppm; $^{13}$C NMR (125 MHz, CDCl$_3$): $\delta_C$ 160.9, 154.1, 152.6, 151.6, 134.7, 131.4, 129.4, 129.2, 128.6, 127.6, 127.5, 126.9, 122.4, 118.3, 115.6 ppm; HRMS (EI) m/z [M+H]$^+$ calcd for C$_{27}$H$_{22}$NOB, 387.1794, found 387.1802.

Example 36: 2-(5-Diphenylboryloxy)-3-phenyl-1H-(pyrazol-1-yl)pyridine

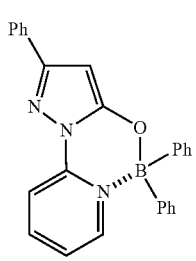

(337 mg, 84%); off-white solid; mp 246-247° C.; $^1$H NMR (300 MHz, CDCl$_3$): $\delta_H$ 8.14-8.04 (m, 2H), 7.93 (d, J=5.85 Hz, 1H), 7.82 (d, J=7.5 Hz, 2H), 7.42-7.33 (m, 3H), 7.27-7.19 (m, 11H), 5.96 (s, 1H) ppm; $^{13}$C NMR (125 MHz, CDCl$_3$): $\delta_C$ 157.06, 156.6, 147.0, 143.0, 142.1, 133.0, 132.5, 129.1, 128.6, 127.6, 127.2, 126.0, 119.3, 113.4, 86.6 ppm; HRMS (EI) m/z [M+H]$^+$ calcd for C$_{26}$H$_{20}$N$_3$OB, 401.1699, found 401.1692.

Example 37: 2-(5-(E-Distyrylboryloxy)-3-phenyl-1H-(pyrazol-1-yl)pyridine

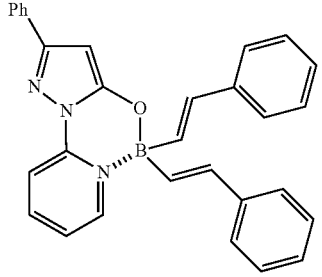

(313 mg, 69%); off-white solid; mp 211-213° C.; $^1$H NMR (300 MHz, CDCl$_3$): $\delta_H$ 8.31 (d, J=5.73 Hz, 1H), 8.16-8.06 (m, 2H), 7.88-7.85 (m, 2H), 7.46-7.35 (m, 6H), 7.32-7.27 (m, 6H), 7.20-7.15 (m, 2H), 6.71-6.63 (m, 4H), 5.96 (s, 1H) ppm; $^{13}$C NMR (125 MHz, CDCl$_3$): $\delta_C$ 156.9, 156.1, 146.8, 142.8, 141.3, 139.2, 139.0, 132.6, 129.1, 128.6, 128.3, 127.1, 126.3, 126.1, 119.7, 113.3, 86.35 ppm; HRMS (EI) m/z [M+H]$^+$ calcd for C$_{30}$H$_{24}$N$_3$OB, 453.2012, found 453.2017.

Example 38: 2-(5-((Bis(benzo[b]thiophen-2-yl)boryl)oxy)-3-phenyl-1H-pyrazol-1-yl)pyridine

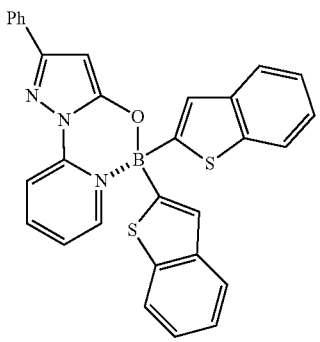

(462 mg, 90%); off-white solid; mp 252-253° C.; $^1$H NMR (300 MHz, CDCl$_3$): $\delta_H$ 8.52 (dd, J=1.26, 8.67 Hz, 1H), 8.29-8.19 (m, 2H), 7.94-7.86 (m, 4H), 7.80-7.76 (m, 2H), 7.66 (dd, J=0.51, 7.08 Hz, 1H), 7.49-7.37 (m, 3H), 7.35-7.24 (m, 4H), 7.71 (s, 2H), 6.42 (s, 1H) ppm; $^{13}$C NMR (125 MHz, CDCl$_3$): $\delta_C$ 156.3, 155.1, 146.6, 145.7, 142.3, 142.2, 141.2, 132.2, 129.9, 129.2, 129.1, 126.3, 124.4, 124.3, 123.8, 122.7, 122.5, 113.8, 87.3 ppm; HRMS (EI) m/z [M+H]$^+$ calcd for C$_{30}$H$_{20}$N$_3$OS$_2$B, 513.1141, found 513.1141.

Example 39: 2-(5-((Bis(4-methoxyphenyl)boryl)oxy)-3-phenyl-1H-pyrazol-1-yl)pyridine

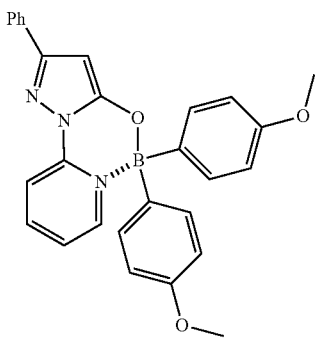

(401 mg, 87%); off-white solid; mp 222-223° C.; $^1$H NMR (500 MHz, CDCl$_3$): $\delta_H$ 8.15 (m, 2H), 7.96 (d, J=5.4 Hz, 1H), 7.85 (d, J=7.05 Hz, 2H), 7.45-7.38 (m, 3H), 7.26-7.22 (m, 5H), 6.84 (d, J=8.45 Hz, 4H), 5.98 (s, 1H), 3.79 (s, 6H) ppm; $^{13}$C NMR (125 MHz, CDCl$_3$): $\delta_C$ 158.9, 156.7, 147.0, 142.8, 142.0, 134.2, 132.6, 129.1, 128.6, 126.0, 119.2, 113.3, 113.2, 86.5, 55.0 ppm; HRMS (EI) m/z [M+H]$^+$ calcd for C$_{28}$H$_{24}$N$_3$O$_3$B, 461.1911, found 461.1911.

Example 40: 2-(5-((Bis(4-fluorophenyl)boryl)oxy)-3-phenyl-1H-pyrazol-1-yl)pyridine

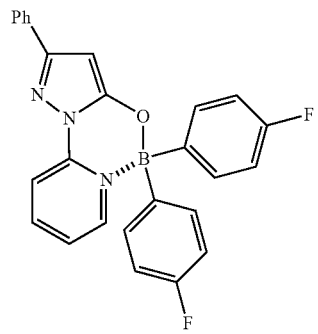

(437 mg, 79%); off-white solid; mp 187-189° C.; $^1$H NMR (500 MHz, CDCl$_3$): $\delta_H$ 8.18-8.11 (m, 2H), 7.89-7.85 (m, 3H), 7.46-7.38 (m, 3H), 7.29-7.24 (m, 5H), 7.0-6.96 (m, 4H), 6.0 (s, 1H) ppm; $^{13}$C NMR (125 MHz, CDCl$_3$): $\delta_C$ 163.6, 161.7, 157.2, 156.4, 146.9, 143.2, 141.7, 134.5 (d, J=28.95 Hz), 132.3, 129.3, 128.6, 126.0, 119.4, 114.6, 114.5, 113.6, 86.6 ppm; HRMS (EI) m/z [M+H]$^+$ calcd for C$_{26}$H$_{18}$N$_3$OBF$_2$, 437.1511, found 437.1511.

Example 41: 2-(2-((Diphenylboryl)oxy)phenyl)benzo[d]oxazole

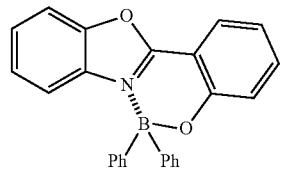

(289 mg, 77%); off-white solid; mp 193-194° C.; $^1$H NMR (300 MHz, CDCl$_3$): $\delta_H$ 7.80-7.77 (dd, J=1.53, 7.89 Hz, 1H), 7.65 (d, J=8.28 Hz, 1H), 7.55-7.49 (m, 1H), 7.44-7.38 (m, 5H), 7.29-7.19 (m, 8H), 6.99 (d, J=8.13 Hz, 1H), 6.89 (t, J=7.26 Hz, 1H) ppm; $^{13}$C NMR (125 MHz, CDCl$_3$): $\delta_C$ 163.2, 161.5, 149.2, 137.6, 133.3, 133.1, 127.4, 126.8, 126.7, 126.4, 126.0, 120.8, 119.0, 117.7, 111.4, 108.2 ppm; HRMS (EI) m/z [M+H]$^+$ calcd for C$_{25}$H$_{18}$NO$_2$B, 375.1431, found 375.1429.

Example 42: 2-(2-((Bis(4-fluorophenyl)boryl)oxy)phenyl)benzo[d]oxazole

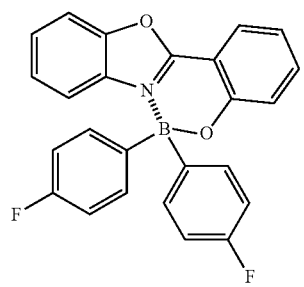

(350 mg, 85%); off-white solid; mp 212-213° C.; $^1$H NMR (300 MHz, CDCl$_3$): $\delta_H$ 7.83-7.80 (dd, J=1.5, 7.89 Hz, 1H), 7.69, (d, J=8.31 Hz, 1H), 7.57-7.52 (t, J=8.01 Hz, 1H), 7.38-7.33 (m, 4H), 7.29 (d, J=7.65 Hz, 1H), 7.19 (d, J=8.49 Hz, 1H), 6.95-6.90 (m, 6H) ppm; $^{13}$C NMR (125 MHz, CDCl$_3$): $\delta_C$ 163.5, 162.9, 161.5, 149.2, 137.8, 134.6, 134.51, 133.0, 126.8, 126.6, 126.0, 120.7, 119.4, 117.32, 114.3, 114.2, 116.7, 108.1 ppm; HRMS (EI) m/z [M+H]$^+$ calcd for C$_{25}$H$_{16}$NO$_2$BF$_2$, 411.1242, found 411.1235.

Example 43: 2-(2-((Diphenylboryl)oxy)phenyl)benzo[d]thiazole

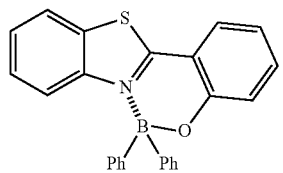

(344 mg, 88%); pale yellow solid; mp 215-216° C.; $^1$H NMR (300 MHz, CDCl$_3$): $\delta_H$ 7.85 (d, J=8.07 Hz, 1H), 7.52-7.35 (m, 7H), 7.29-7.12 (m, 9H), 6.82 (t, J=7.35 Hz, 1H) ppm; $^{13}$C NMR (125 MHz, CDCl$_3$): $\delta_C$ 168.6, 159.6, 146.2, 136.8, 133.3, 133.2, 130.1, 127.7, 127.4, 126.7, 126.2, 121.9, 121.7, 120.9, 119.3, 115.6 ppm; HRMS (EI) m/z [M+H]$^+$ calcd for C$_{25}$H$_{18}$NOBS, 391.1202, found 391.1210.

Example 44: 2-(2-((Bis(6-methoxynaphthalen-2-yl)boryl)oxy)phenyl)benzo[d]thiazolen

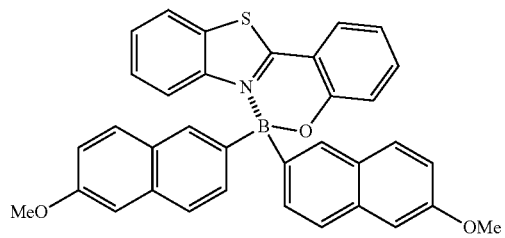

(364 mg, 66%); pale yellow solid; mp 227-230° C.; $^1$H NMR (300 MHz, CDCl$_3$): $\delta_H$ 7.84 (d, J=8.13 Hz, 1H), 7.70 (s, 2H), 7.64-7.34 (m, 10H), 7.24 (m, 2H), 7.09-7.08 (m, 2H), 7.04-7.00 (m, 2H), 6.80 (t, J=7.42 Hz, 1H), 3.87 (s, 6H) ppm; $^{13}$C NMR (125 MHz, CDCl$_3$): $\delta_C$ 168.7, 159.6, 157.2, 146.2, 136.8, 133.9, 132.6, 131.9, 130.2, 129.7, 128.9, 127.8, 127.4, 126.3, 125.6, 121.0, 121.7, 120.9, 119.4, 117.7, 115.7, 105.6, 55.3 ppm; HRMS (EI) m/z [M+H]$^+$ calcd for C$_{35}$H$_{26}$NO$_3$BS, 551.1726, found 551.1725.

Example 45: 2-((Diphenylboryl)oxy)-N,N-dimethylaniline

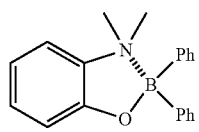

(160 mg, 53%); pale yellow oil; $^1$H NMR (300 MHz, CDCl$_3$): $\delta_H$ 7.69 (d, J=7.08 Hz, 4H), 7.51-7.42 (m, 1H), 7.32-7.14 (m, 7H), 7.07 (d, J=7.83 Hz, 1H), 6.81 (t, J=7.65 Hz, 1H), 2.70 (s, 6H) ppm; HRMS (EI) m/z [M+14]$^+$ calcd for C$_{20}$H$_{20}$NOB, 301.1638, found 301.1620.

V. Synthesis of Four-Coordinated Organic Boron Compounds by Bis-Diarylborylation Four-coordinated organic boron compounds were synthesized according to the reaction scheme below.

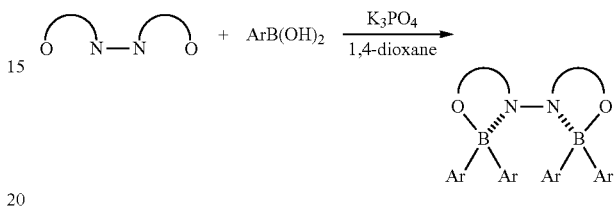

An arylboronic acid (18.0 mmol) and K$_3$PO$_4$ (636.8 mg, 3.0 mmol) were each added to a solution of a selected bidentate N,O-ligand (1.0 mmol) in 1,4-dioxane (50 mL), and the resultant was heated to reflux for 16 hours to 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous Na$_2$SO$_4$ and concentrated under reduced pressure. The resulting solid residue was purified by column chromatography (15% to 20%, acetone in hexane) to obtain each of the compounds.

Example 46: 2,5-Bis(2-((diphenylboryl)oxy)phenyl)thiazolo[5,4-d]thiazole

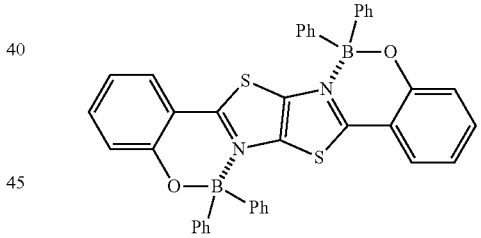

(406 mg, 62%); yellow solid; mp 233-236° C.; $^1$H NMR (300 MHz, CDCl$_3$): $\delta_H$ 8.33 (d, J=8.1 Hz, 2H), 7.74 (t, J=8.4 Hz, 3H), 7.52-7.27 (m, 20H), 7.15 (m, 2H), 6.78 (t, J=7.5 Hz, 1H) ppm; HRMS (EI) m/z [M+H]$^+$ calcd for C$_{40}$H$_{28}$N$_2$O$_2$B$_2$S$_2$, 654.1778, found 654.1769.

Example 47: (E)-2,2'-(1,1,6,6-tetraphenyl-2,5-dioxa-1,6-diborahex-3-en-3,4-diyl)dipyridine

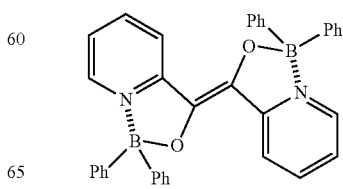

(174 mg, 32%); yellow solid; mp 197-198° C.; $^1$H NMR (300 MHz, CDCl$_3$): $\delta_H$ 8.78 (d, J=8.1 Hz, 1H), 8.38 (d, J=5.7 Hz, 1H), 8.19 (d, J=7.8 Hz, 1H), 7.97 (q, J=7.8 Hz, 2H), 7.81 (d, J=6.6 Hz, 1H), 7.55-7.47 (m, 6H), 7.44-7.28 (m, 10H), 7.23-7.15 (m, 8H) ppm; HRMS (EI) m/z [M+H]$^+$ calcd for C$_{36}$H$_{28}$N$_2$O$_2$B$_2$, 542.2337, found 542.2314.

VI. Synthesis of Four-Coordinated Organic Boron Compounds by Diarylborylation of 1,3-Diketone Compounds Four-coordinated organic boron compounds were synthesized according to the reaction scheme below.

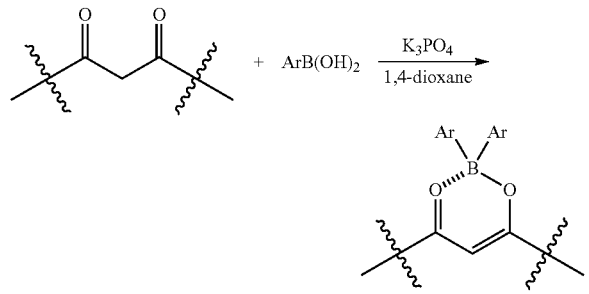

An arylboronic acid (9.0 mmol) and K$_3$PO$_4$ (636.8 mg, 3.0 mmol) were each added to a solution of a selected 1,3-diketone (1.0 mmol) in 1,4-dioxane (50 mL), and the resultant was heated to reflux for 16 hours to 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous Na$_2$SO$_4$ and concentrated under reduced pressure. The resulting solid residue was purified by column chromatography (5% to 20%, acetone in hexane) to obtain each of the compounds.

Example 48: (Z)-3-((Diphenylboryl)oxy)-1,3-diphenyl-2-propen-1-one

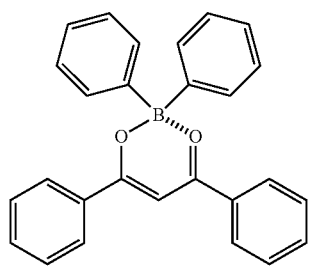

(334 mg, 86%); yellow solid; mp 233-234° C.; $^1$H NMR (300 MHz, CDCl$_3$): $\delta_H$ 8.16 (d, J=7.5 Hz, 4H), 7.65 (d, J=7.5 Hz, 6H), 7.53 (d, J=7.8 Hz, 4H), 7.29-7.17 (m, 6H), 6.97 (s, 1H) ppm; $^{13}$C NMR (125 MHz, CDCl$_3$): $\delta_C$ 183.0, 134.4, 133.4, 131.4, 129.0, 128.5, 127.3, 126.6, 94.2 ppm; HRMS (EI) m/z [M+H]$^+$ calcd for C$_{27}$H$_{21}$O$_2$B, 388.1635, found 388.1630.

Example 49: (Z)-3-((Di-p-tolylboryl)oxy)-1,3-diphenyl-2-propen-1-one

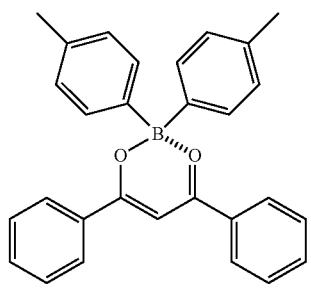

(337 mg, 81%); yellow solid; mp 218-219° C.; $^1$H NMR (300 MHz, CDCl$_3$): $\delta_H$ 8.15 (d, J=7.5 Hz, 4H), 7.63 (t, J=7.2 Hz, 2H), 7.51 (t, J=8.1 Hz, 8H), 7.10 (d, J=7.5 Hz, 4H), 6.96 (s, 1H), 2.29 (s, 6H) ppm; $^{13}$C NMR (125 MHz, CDCl$_3$): $\delta_C$ 183.0, 135.9, 134.3, 133.5, 131.6, 128.9, 128.5, 128.1, 94.0, 21.3 ppm; HRMS (EI) m/z [M+H]$^+$ calcd for C$_{29}$H$_{25}$O$_2$B, 416.1948, found 416.1943.

Example 50: (Z)-3-((Di-m-tolylboryl)oxy)-1,3-diphenyl-2-propen-1-one

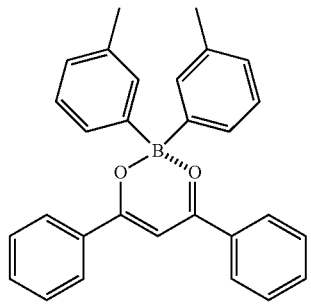

(329 mg, 79%); yellow solid; mp 242-243° C.; $^1$H NMR (500 MHz, CDCl$_3$): $\delta_H$ 8.22 (d, J=7.45 Hz, 4H), 7.69 (t, J=7.35 Hz, 2H), 7.58 (t, J=7.9 Hz, 4H), 7.46 (d, J=6.5 Hz, 4H), 7.23 (t, J=7.6 Hz, 2H), 7.07 (t, J=7.5 Hz, 2H), 7.01 (s, 1H), 2.34 (s, 6H) ppm; $^{13}$C NMR (125 MHz, CDCl$_3$): $\delta_C$ 183.0, 136.3, 134.3, 133.4, 132.1, 129.0, 128.5, 128.4, 127.4, 127.1, 94.1, 21.8 ppm; HRMS (EI) m/z [M+H]$^+$ calcd for C$_{29}$H$_{25}$O$_2$B, 416.1948, found 416.1956.

Example 51: (Z)-3-((Di-o-tolylboryl)oxy)-1,3-diphenyl-2-propen-1-one

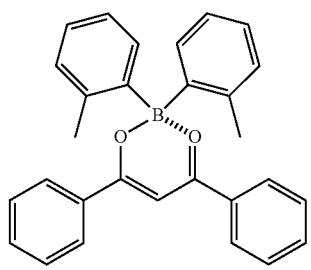

(312 mg, 75%); yellow solid; mp 249-250° C.; $^1$H NMR (500 MHz, CDCl$_3$): $\delta_H$ 8.20 (d, J=7.45 Hz, 4H), 7.69 (t, J=7.3 Hz, 2H), 7.58 (t, J=7.9 Hz, 4H), 7.53 (d, J=7.3 Hz, 2H), 7.19-7.16 (m, 2H), 7.13 (t, J=7.0 Hz, 4H), 7.05 (s, 1H), 2.39 (s, 6H) ppm; $^{13}$C NMR (125 MHz, CDCl$_3$): $\delta_C$ 182.3, 141.9, 134.3, 133.3, 132.6, 130.1, 129.0, 128.5, 126.8, 124.1, 93.6, 22.6 ppm; HRMS (EI) m/z [M+H]$^+$ calcd for C$_{29}$H$_{25}$O$_2$B, 416.1948, found 416.1939.

Example 52: (Z)-3-((Bis(4-vinylphenyl)boryl)oxy)-1,3-diphenyl-2-propen-1-one

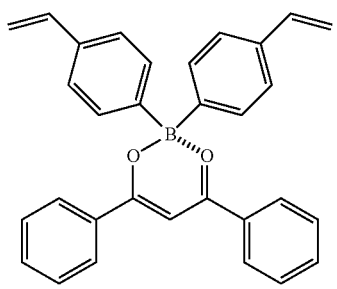

(348 mg, 79%); yellow solid; mp 181-182° C.; $^1$H NMR (500 MHz, CDCl$_3$): $\delta_H$ 8.21 (d, J=7.5 Hz, 4H), 7.70 (t, J=7.35 Hz, 2H), 7.61-7.57 (m, 8H), 7.36 (d, J=8.0 Hz, 4H), 7.03 (s, 1H), 6.72 (dd, J=10.9, 17.6 Hz, 2H), 5.71 (d, J=17.7 Hz, 2H), 5.16 (d, J=11.0 Hz, 2H) ppm; $^{13}$C NMR (125 MHz, CDCl$_3$): $\delta_C$ 183.0, 137.5, 135.9, 134.4, 133.3, 131.6, 129.0, 128.5, 125.3, 112.4, 94.2 ppm; HRMS (EI) m/z [M+H]$^+$ calcd for C$_{31}$H$_{25}$O$_2$B, 440.1948, found 440.1943.

Example 53: (Z)-3-((Bis(3,5-difluorophenyl)boryl)oxy)-1,3-diphenyl-2-propen-1-one

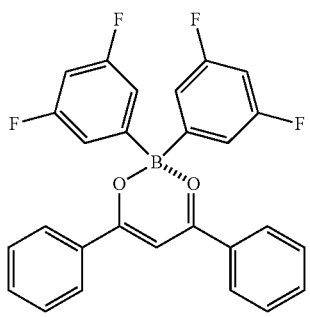

(410 mg, 89%); yellow solid; mp 275-276° C.; $^1$H NMR (500 MHz, CDCl$_3$): $\delta_H$ 8.21 (d, J=7.5 Hz, 4H), 7.75 (t, J=7.35 Hz, 2H), 7.63 (t, J=7.9 Hz, 4H), 7.08-7.06 (m, 5H), 6.65 (tt, J=2.35, 9.15 Hz, 1H) ppm; $^{13}$C NMR (125 MHz, CDCl$_3$): $\delta_C$ 183.1, 163.9 (d, J=44.3 Hz), 161.9 (d, J=44.7 Hz), 135.1, 132.6, 129.3, 128.6, 112.9 (dd, J=16.7, 66.95 Hz), 101.9 (t, J=101.35 Hz), 94.4 ppm; HRMS (EI) m/z [M+H]$^+$ calcd for C$_{27}$H$_{17}$O$_2$BF$_4$, 460.1258, found 460.1247.

Example 54: (Z)-3-((Bis(4-nitrophenyl)boryl)oxy)-1,3-diphenyl-2-propen-1-one

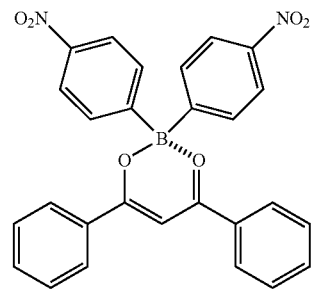

(325 mg, 68%); yellow solid; mp 244-245° C.; $^1$H NMR (300 MHz, CDCl$_3$): $\delta_H$ 8.21 (d, J=7.5 Hz, 4H), 8.11 (d, J=8.7 Hz, 4H), 7.73 (d, J=8.4 Hz, 6H), 7.62 (t, J=7.8 Hz, 4H), 7.10 (s, 1H) ppm; $^{13}$C NMR (125 MHz, CDCl$_3$): $\delta_C$ 183.3, 147.3, 135.4, 132.4, 131.7, 129.4, 128.6, 122.4, 94.8 ppm; HRMS (EI) m/z [M+H]$^+$ calcd for C$_{27}$H$_{19}$N$_2$O$_6$B, 478.1336, found 478.1330.

Example 55: (Z)-3-((Bis(4-iodophenyl)boryl)oxy)-1,3-diphenyl-2-propen-1-one

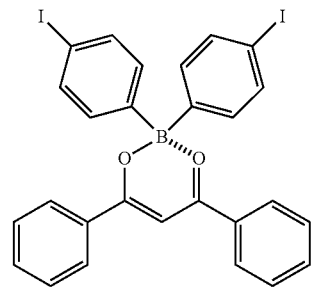

(570 mg, 89%); yellow solid; mp 231-232° C.; $^1$H NMR (300 MHz, CDCl$_3$): $\delta_H$ 8.14 (d, J=7.2 Hz, 4H), 7.67 (t, J=14.7 Hz, 2H), 7.60-7.52 (m, 8H), 7.3-7.28 (m, 4H), 6.99 (s, 1H) ppm; $^{13}$C NMR (125 MHz, CDCl$_3$): $\delta_C$ 183.1, 136.4, 134.8, 133.4, 133.0, 129.2, 128.5, 94.3, 93.1 ppm; HRMS (EI) m/z [M+H]$^+$ calcd for C$_{27}$H$_{19}$O$_2$BI$_2$, 639.9567, found 639.9563.

Example 56: (Z)-3-((Di(3-thienyl)boryl)oxy)-1,3-diphenyl-2-propen-1-one

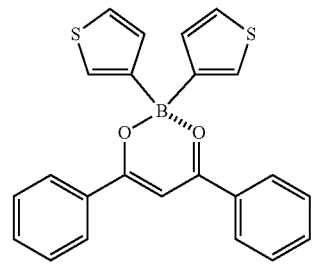

(312 mg, 78%); yellow solid; mp 216-217° C.; $^1$H NMR (500 MHz, CDCl$_3$): $\delta_H$ 8.18-8.16 (m, 4H), 7.70-7.67 (m, 2H), 7.57 (t, J=7.8 Hz, 4H), 7.36-7.31 (m, 6H), 7.0 (s, 1H) ppm; $^{13}$C NMR (125 MHz, CDCl$_3$): $\delta_C$ 182.9, 134.4, 133.2, 131.3, 129.0, 128.5, 126.8, 124.3, 93.4 ppm; HRMS (EI) m/z [M+H]$^+$ calcd for C$_{23}$H$_{17}$O$_2$BS$_2$, 400.0763, found 400.0769.

Example 57: (Z)-3-((Bis(3-dimethylaminophenyl) boryl)oxy)-1,3-diphenyl-2-propen-1-one

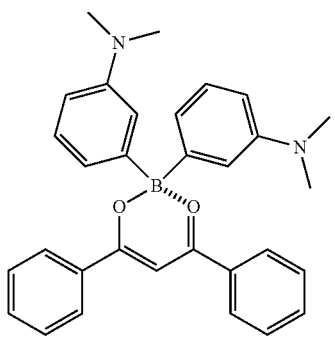

(327 mg, 64%); red solid; mp 138-139° C.; $^1$H NMR (300 MHz, CDCl$_3$): $\delta_H$ 8.17 (d, J=7.4 Hz, 4H), 7.63 (t, J=7.4 Hz, 2H), 7.51 (t, J=7.8 Hz, 4H), 7.18-7.11 (m, 4H), 6.96 (s, 1H), 6.66-6.63 (m, 2H), 2.86 (s, 12H) ppm; HRMS (EI) m/z [M+H]$^+$ calcd for C$_{31}$H$_{31}$N$_2$O$_2$B, 474.2479, found 474.2474.

Example 58: (Z)-3-((Bis(4-fluorophenyl)boryl)oxy)-1,3-diphenyl-2-propen-1-one

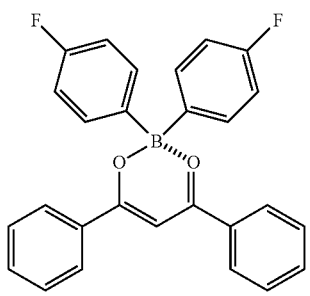

(361 mg, 85%); yellow solid; mp 227-228° C.; $^1$H NMR (500 MHz, CDCl$_3$): $\delta_H$ 8.20 (d, J=7.5 Hz, 4H), 7.71 (t, J=7.74 Hz, 2H), 7.61-7.55 (m, 8H), 7.05 (s, 1H), 7.00 (t, J=8.9 Hz, 4H) ppm; $^{13}$C NMR (125 MHz, CDCl$_3$): $\delta_C$ 183.0, 163.3, 161.4, 134.6, 133.1, 133.0, 133.9, 129.1, 128.5, 114.2, 114.0, 94.2 ppm; HRMS (EI) m/z [M+H]$^+$ calcd for C$_{27}$H$_{19}$O$_2$BF$_2$, 424.1446, found 424.1453.

Example 59: (Z)-3-((Diphenylboryl)oxy)-1,3-bis(4-methoxyphenyl)prop-2-en-1-one

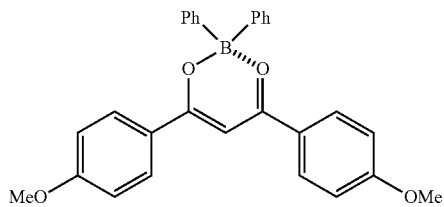

(323 mg, 72%); yellow solid; mp 281-284° C.; $^1$H NMR (300 MHz, CDCl$_3$): $\delta_H$ 8.15 (d, J=9.0 Hz, 4H), 7.60 (dd, J=2.34, 8.01 Hz, 4H), 7.28-7.17 (m, 6H), 7.01 (d, J=9.0 Hz), 6.83 (s, 1H), 3.91 (s, 6H) ppm; $^{13}$C NMR (125 MHz, CDCl$_3$): $\delta_C$ 180.9, 164.5, 131.4, 130.7, 127.1, 126.3, 126.0, 114.3, 92.5, 55.6 ppm; HRMS (EI) m/z [M+H]$^+$ calcd for C$_{29}$H$_{25}$O$_4$B, 448.1846, found 448.1836.

Example 60: (Z)-3-((Bis(4-vinylphenyl)boryl)oxy)-1,3-bis(4-methoxyphenyl))-2-propen-1-one

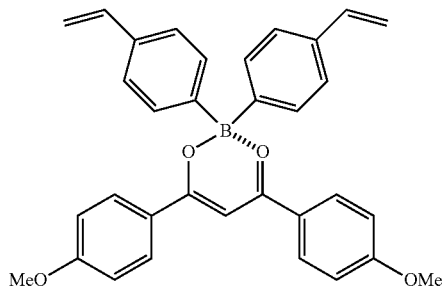

(430 mg, 86%); yellow solid; mp 204-205° C.; $^1$H NMR (300 MHz, CDCl$_3$): $\delta_H$ 8.15 (d, J=9.0 Hz, 4H), 7.56 (d, J=8.1 Hz, 4H), 7.31 (d, J=7.8 Hz, 4H), 7.02-6.99 (m, 4H), 6.82 (s, 1H), 6.68 (dd, J=10.8, 17.7 Hz, 2H), 5.66 (dd, J=1.2, 17.7 Hz, 2H), 5.18 (dd, J=0.9, 12.0 Hz, 2H), 3.90 (s, 6H) ppm; $^{13}$C NMR (125 MHz, CDCl$_3$): $\delta_C$ 180.9, 164.6, 137.6, 135.7, 131.6, 130.7, 125.9, 125.2, 114.3, 112.2, 92.6, 55.7 ppm; HRMS (EI) m/z [M+H]$^+$ calcd for C$_{33}$H$_{29}$O$_4$B, 500.2159, found 500.2162.

Example 61: (Z)-3-((Bis(4-bromophenyl)boryl)oxy)-1,3-bis(4-methoxyphenyl))-2-propen-1-one

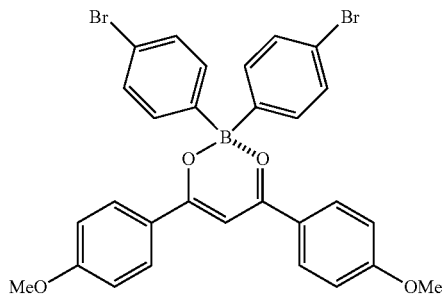

(513 mg, 85%); yellow solid; mp 249-250° C.; $^1$H NMR (300 MHz, CDCl$_3$): $\delta_H$ 8.12 (d, J=9.0 Hz, 4H), 7.43-7.34 (m, 8H), 7.01 (d, J=8.7 Hz, 4H), 6.84 (s, 1H), 3.90 (s, 6H) ppm; $^{13}$C NMR (125 MHz, CDCl$_3$): $\delta_C$ 180.8, 164.9, 133.1, 130.7, 130.3, 125.6, 120.9, 114.5, 92.7, 55.7 ppm; HRMS (EI) m/z [M+H]$^+$ calcd for C$_{29}$H$_{33}$O$_4$BBr$_2$, 604.0056, found 604.0059.

Example 62: (Z)-3-((Diphenylboryl)oxy)-1-phenyl-3-(4-(trifluoromethyl)phenyl)-2-propen-1-one

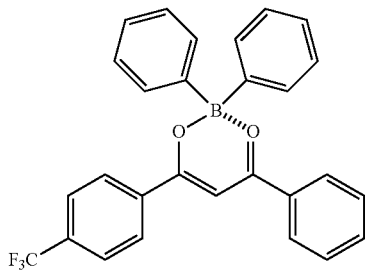

(401 mg, 88%); yellow solid; mp 211-212° C.; $^1$H NMR (300 MHz, CDCl$_3$): $\delta_H$ 8.25 (d, J=8.1 Hz, 2H), 8.18 (d, J=8.4 Hz, 2H), 7.79 (d, J=8.4 Hz, 2H), 7.69 (t, J=7.5 Hz, 1H), 7.61-7.53 (m, 6H), 7.31-7.21 (m, 6H), 6.98 (s, 1H) ppm; $^{13}$C NMR (125 MHz, CDCl$_3$): $\delta_C$ 184.4, 181.1, 136.6, 135.0, 132.9, 131.3, 129.2, 128.8, 128.7, 127.3, 126.8, 126.0, 125.9, 124.5, 122.4, 94.7 ppm; HRMS (EI) m/z [M+H]$^+$ calcd for C$_{28}$H$_{20}$O$_2$BF$_3$, 456.1508, found 456.1507.

Example 63: (Z)-3-((Bis(4-vinylphenyl)boryl)oxy)-1-phenyl-3-(4-(trifluoromethyl)phenyl)-2-propen-1-one

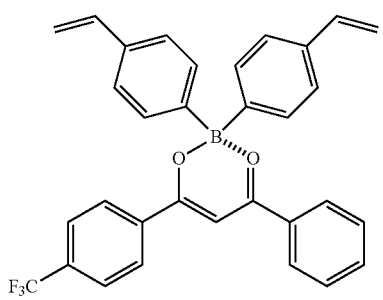

(381 mg, 75%); yellow solid; mp 198-199° C.; $^1$H NMR (300 MHz, CDCl$_3$): $\delta_H$ 8.25 (d, J=8.4 Hz, 2H), 8.18 (d, J=8.7 Hz, 2H), 7.69 (t, J=7.5 Hz, 1H), 7.59-7.53 (m, 6H), 7.33 (d, J=8.1 Hz, 4H), 7.0 (s, 1H), 6.85 (dd, J=10.8, 17.7 Hz, 2H), 5.68 (d, J=17.7 Hz, 2H), 5.14 (d, J=10.8 Hz, 2H) ppm; $^{13}$C NMR (125 MHz, CDCl$_3$): $\delta_C$ 184.4, 181.1, 137.4, 136.6, 136.1, 135.1, 132.9, 131.6, 129.2, 128.8, 128.7, 126.0 (d, J=14.35 Hz), 125.3, 112.6, 94.8 ppm; HRMS (EI) m/z [M+H]$^+$ calcd for C$_{32}$H$_{24}$O$_2$BF$_3$, 508.1821, found 508.1826.

Example 64: (Z)-3-((Bis(4-bromophenyl)boryl)oxy)-1-phenyl-3-(4-(trifluoromethyl)phenyl)-2-propen-1-one

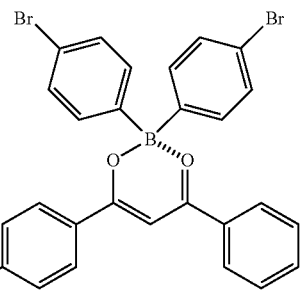

(484 mg, 79%); yellow solid; mp 241-242° C.; $^1$H NMR (300 MHz, CDCl$_3$): $\delta_H$ 8.24 (d, J=8.1 Hz, 2H), 8.17 (d, J=8.7 Hz, 2H), 7.81 (d, J=8.1 Hz, 2H), 7.72 (t, J=7.5 Hz, 1H), 7.58 (t, J=7.8 Hz), 7.44-7.37 (m, 8H), 7.02 (s, 1H) ppm; $^{13}$C NMR (125 MHz, CDCl$_3$): $\delta_C$ 184.5, 181.2, 136.2, 135.5, 133.1, 132.5, 130.5, 129.3, 128.8, 128.7, 126.1 (t, J=14.4 Hz), 122.3, 121.3, 94.8 ppm; HRMS (EI) m/z [M+H]$^+$ calcd for C$_{28}$H$_{18}$O$_2$BF$_2$Br$_2$, 611.9719, found 611.9729.

Example 65: (Z)-3-((Diphenyl)boryl)oxy)-1-(4-methoxyphenyl)-3-(4-(trifluoromethyl)phenyl)-2-propen-1-one

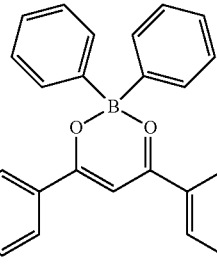

(389 mg, 80%); yellow solid; mp 232-233° C.; $^1$H NMR (300 MHz, CDCl$_3$): $\delta_H$ 8.22 (m, 4H), 7.76 (d, J=8.1 Hz, 2H), 7.61-7.58 (m, 4H), 7.30-7.18 (m, 6H), 7.01 (d, J=9.0 Hz), 6.89 (s, 1H), 3.90 (s, 3H) ppm; $^{13}$C NMR (125 MHz, CDCl$_3$): $\delta_C$ 183.3, 179.5, 165.5, 136.9, 131.4, 128.4, 127.3, 126.6, 125.9, 125.2, 114.6, 93.9, 55.8 ppm; HRMS (EI) m/z [M+H]$^+$ calcd for C$_{29}$H$_{22}$O$_3$BF$_3$, 486.1614, found 486.1622.

Example 66: (Z)-3-((Bis(4-vinylphenyl)boryl)oxy)-1-(4-methoxyphenyl)-3-(4-(trifluoromethyl)phenyl)-2-propen-1-one

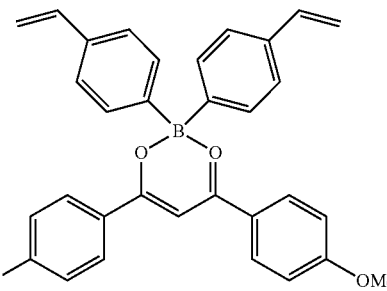

(485 mg, 90%); yellow solid; mp 195-196° C.; $^1$H NMR (300 MHz, CDCl$_3$): $\delta_H$ 8.23-8.15 (m, 4H), 7.77 (d, J=8.1 Hz, 2H), 7.54 (d, J=8.1 Hz, 4H), 7.32 (d, J=7.8 Hz, 4H), 7.03 (d, J=9.0 Hz, 2H), 6.90 (s, 1H), 6.68 (dd, J=10.8, 17.7 Hz, 2H), 5.67 (d, J=17.7 Hz, 2H), 5.13 (d, J=10.8 Hz, 2H), 3.92 (s, 3H) ppm; $^{13}$C NMR (125 MHz, CDCl$_3$): $\delta_C$ 183.3, 179.5, 165.6, 137.5, 135.9, 131.6, 131.4, 128.4, 128.4, 125.8, 125.3, 114.6, 112.5, 94.0, 55.8 ppm; HRMS (EI) m/z [M+H]$^+$ calcd for C$_{33}$H$_{26}$O$_3$BF$_3$, 538.1927, found 538.1922.

Example 67: (Z)-3-((Bis(4-bromophenyl)boryl)oxy)-1-(4-methoxyphenyl)-3-(4-(trifluoromethyl)phenyl)-2-propen-1-one

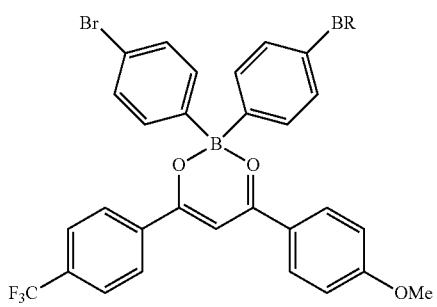

(546 mg, 85%); yellow solid; mp 221-222° C.; $^1$H NMR (300 MHz, CDCl$_3$): $\delta_H$ 8.21-8.15 (m, 4H), 7.79 (d, J=8.4 Hz, 2H), 7.42-7.36 (m, 8H), 7.04 (d, J=9.0 Hz, 2H), 6.93 (s, 1H), 3.94 (s, 3H) ppm; $^{13}$C NMR (125 MHz, CDCl$_3$): $\delta_C$ 183.3, 179.5, 165.8, 136.6, 133.1, 131.5, 130.4, 128.4, 126.0, 125.9, 124.8, 124.5, 121.6, 94.1, 55.8 ppm; HRMS (EI) m/z [M+H]$^+$ calcd for C$_{29}$H$_{20}$O$_3$BF$_3$Br$_3$, 641.9824, found 641.9816.

Example 68: (Z)-3-((Diphenylboryl)oxy)-3-(2-furyl)-1-phenyl-2-propen-1-one

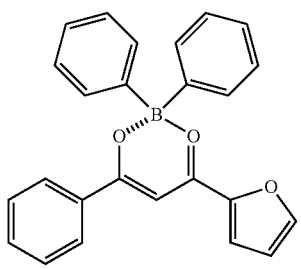

(269 mg, 69%); yellow solid; mp 195-196° C.; $^1$H NMR (300 MHz, CDCl$_3$): $\delta_H$ 8.14 (d, J=7.5 Hz, 2H), 7.67-7.48 (m, 9H), 7.28-7.16 (m, 6H), 6.89 (s, 1H), 6.65 (dd, J=1.5, 3.6 Hz, 1H) ppm; $^{13}$C NMR (125 MHz, CDCl$_3$): $\delta_C$ 182.6, 172.0, 149.5, 148.3, 134.3, 133.3, 131.5, 129.0, 128.6, 127.2, 126.6, 119.7, 113.7, 93.5 ppm; HRMS (EI) m/z [M+H]$^+$ calcd for C$_{25}$H$_{19}$O$_3$B, 378.1427, found 378.1435.

Example 69: (Z)-3-((Diphenylboryl)oxy)-3-(pentafluorophenyl)-1-phenyl-2-propen-1-one

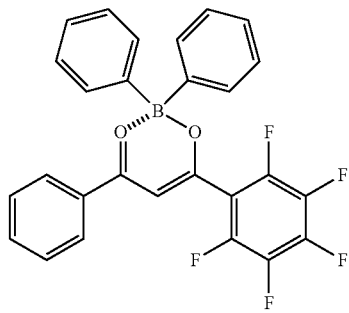

(406 mg, 85%); yellow solid; mp 170-171° C.; $^1$H NMR (300 MHz, CDCl$_3$): $\delta_H$ 8.15 (d, J=7.5 Hz, 2H), 7.73 (t, J=7.2 Hz, 1H), 7.60-7.54 (m, 6H), 7.32-7.20 (m, 6H), 6.7 (s, 1H) ppm; $^{13}$C NMR (125 MHz, CDCl$_3$): $\delta_C$ 185.4, 174.1, 135.7, 134.7, 133.4, 132.2, 131.4, 129.3, 129.2, 128.9, 127.4, 127.3, 126.9, 100.6 (d, J=16.85 Hz) ppm; HRMS (EI) m/z [M+H]$^+$ calcd for C$_{27}$H$_{16}$O$_2$BF$_5$, 478.1164, found 478.1146.

Example 70: (1E,4Z,6E)-5-((Diphenylboryl)oxy)-1,7-bis(4-hydroxy-3-methoxyphenyl)hepta-1,4,6-trien-3-one

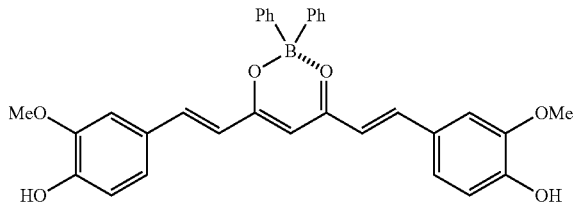

(165 mg, 31%); red solid; mp 254-259° C.; $^1$H NMR (500 MHz, DMSO-d$_6$): $\delta_H$ 10.23 (bs, 2H), 7.98 (d, J=15.5 Hz, 2H), 7.49-7.46 (m, 6H), 7.34 (dd, J=1.6, 8.25 Hz, 2H), 7.19 (t, J=7.1 Hz, 4H), 7.12-7.09 (m, 2H), 6.96 (d, J=15.5 Hz, 2H), 6.87 (d, J=8.1 Hz, 2H), 6.25 (s, 1H), 3.86 (s, 6H) ppm; $^{13}$C NMR (125 MHz, CDCl$_3$): $\delta_C$ 179.9, 151.1, 148.6, 145.4, 131.5, 127.3, 126.6, 126.3, 124.8, 119.8, 116.3, 112.8, 56.2 ppm; HRMS (EI) m/z [M+H]$^+$ calcd for C$_{33}$H$_{29}$O$_6$B, 532.2057, found 532.2064.

Example 71: 2-Acetyl-3-((diphenylboryl)oxy)-5,5-dimethylcyclohex-2-enone

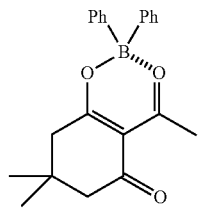

(270 mg, 78%); off-white solid; mp 86-87° C.; $^1$H NMR (300 MHz, CDCl$_3$): $\delta_H$ 7.43-7.40 (m, 4H), 7.30-7.22 (m, 6H), 2.76 (s, 3H), 2.70 (s, 2H), 2.36 (m, 2H), 1.07 (s, 6H) ppm; $^{13}$C NMR (125 MHz, CDCl$_3$): $\delta_C$ 197.7, 196.1, 193.7, 131.1, 127.5, 127.1, 52.1, 47.3, 30.8, 28.2, 27.3 ppm; HRMS (EI) m/z [M+H]$^+$ calcd for C$_{22}$H$_{23}$O$_3$B, 346.1740, found 346.1741.

Example 72: 4-Acetyl-5-((diphenylboryl)oxy)-1,6-dihydro-[1,1'-biphenyl]-3(2H)-one

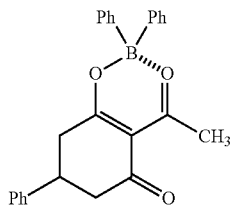

(272 mg, 69%); off-white solid; mp 65-66° C.; $^1$H NMR (300 MHz, CDCl$_3$): $\delta_H$ 7.47-7.39 (m, 2H), 7.37-7.18 (m, 13H), 3.43-3.34 (m, 1H), 3.17-2.93 (m, 2H), 2.84-2.63 (m, 5H) ppm; $^{13}$C NMR (125 MHz, CDCl$_3$): $\delta_C$ 198.3, 195.7, 193.2, 140.9, 131.2, 131.0, 129.1, 127.6, 127.5 (d, J=9.75 Hz), 127.2 (d, J=12.85 Hz), 126.5, 113.4, 45.5, 40.9, 36.5, 27.5 ppm; HRMS (EI) m/z [M+H]$^+$ calcd for C$_{26}$H$_{23}$O$_3$B, 394.1740, found 394.1748.

Example 73: 1-(2-((Diphenylboryl)oxy)cyclohex-1-en-1-yl)ethanone

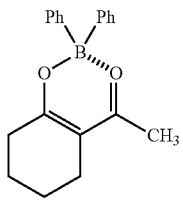

(164 mg, 54%); off-white solid; mp 97-98° C.; $^1$H NMR (300 MHz, CDCl$_3$): $\delta_H$ 7.44 (d, J=6.9 Hz, 4H), 7.27-7.18 (m, 6H), 2.53 (t, J=6.0 Hz, 2H), 2.27-2.22 (m, 5H), 1.74-1.65 (m, 4H) ppm; $^{13}$C NMR (125 MHz, CDCl$_3$): $\delta_C$ 190.6, 188.6, 131.3, 127.2, 126.4, 108.9, 32.8, 23.6, 22.4, 22.2, 21.4 ppm; ESI-LCMS: m/z 305 [M+H]$^+$, 304, 227.

Example 74: 1-(2-((Diphenylboryl)oxy)cyclopent-1-en-1-yl)ethanone

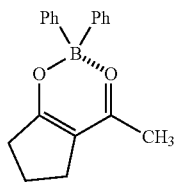

(164 mg, 54%); off-white solid; mp 97-98° C.; $^1$H NMR (300 MHz, CDCl$_3$): $\delta_H$ 7.46 (d, J=6.9 Hz, 4H), 7.28-7.17 (m, 6H), 2.67 (t, J=7.8 Hz, 2H), 2.54 (t, J=7.2 Hz, 2H), 2.20 (s, 3H), 2.01-1.96 (m, 2H) ppm; $^{13}$C NMR (125 MHz, CDCl$_3$): $\delta_C$ 197.6, 186.2, 131.3, 127.2, 126.6, 112.1, 34.8, 25.8, 22.5, 19.8 ppm; HRMS (EI) m/z [M+H]$^+$ calcd for C$_{19}$H$_{19}$O$_2$B, 290.1478, found 290.1468.

VII. Synthesis of Four-Coordinated Organic Boron Compounds by Diarylborylation of N,N-Compounds Four-coordinated organic boron compounds were synthesized according to the reaction scheme below.

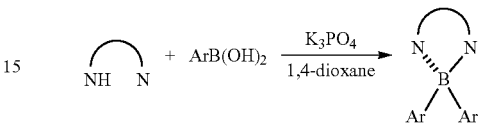

An arylboronic acid (9.0 mmol) and K$_3$PO$_4$ (636.8 mg, 3.0 mmol) were each added to a solution of a selected N,N-ligand (1.0 mmol) in 1,4-dioxane (50 mL), and the resultant was heated to reflux for 16 hours to 20 hours. The reaction solution was concentrated under vacuum, and EtOAc (10 mL) and water (10 mL) were added to the remaining concentrate to separate the organic layer. The aqueous layer was extracted with EtOAc (10 mL). The combined organic layers were dried over anhydrous Na$_2$SO$_4$ and concentrated under reduced pressure. The resulting solid residue was purified by column chromatography (5% to 20%, acetone in hexane) to obtain each of the compounds.

Example 75: (E)-N-(((1-diphenylboryl)-1H-pyrol-2-yl)methylene)aniline

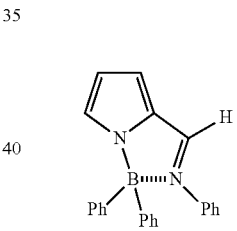

(194 mg, 58%); yellow solid; mp 161-162° C.; $^1$H NMR (500 MHz, CDCl$_3$): $\delta_H$ 8.4 (s, 1H), 7.29-7.27 (m, 8H), 7.25-7.20 (m, 9H), 7.04 (d, J=4.25 Hz, 1H), 6.59-6.57 (m, 1H) ppm; $^{13}$C NMR (125 MHz, CDCl$_3$): $\delta_C$ 150.4, 142.4, 134.2, 133.2, 131.7, 129.3, 127.5, 127.3, 126.6, 122.4, 117.2, 114.9 ppm; HRMS (EI) m/z [M+H]$^+$ calcd for C$_{23}$H$_{19}$N$_2$B, 334.1641, found 334.1642.

Example 76: 1-(Diphenylboryl)-2-(pyridine-2-yl)-1H-indole

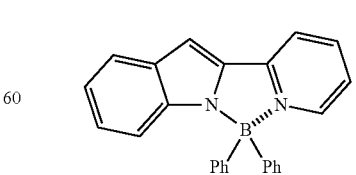

(283 mg, 79%); yellow solid; mp 255-256° C. (lit.[6] 255° C.); $^1$H NMR (500 MHz, CDCl$_3$): $\delta_H$ 8.44 (d, J=5.7 Hz, 1H), 8.02-7.99 (m, 1H), 7.74 (d, J=7.8 Hz, 1H), 7.32-7.30 (m, 5H), 7.27-7.24 (m, 7H), 7.15 (s, 1H), 7.12-7.05 (m, 2H) ppm; $^{13}$C NMR (125 MHz, CDCl$_3$): δ$_C$ 149.7, 142.5, 140.9, 139.3, 136.5, 133.3, 132.7, 127.6, 126.9, 123.3, 122.2, 121.3, 119.7, 118.7, 114.2, 98.7 ppm; HRMS (EI) m/z [M+H]$^+$ calcd for C$_{25}$H$_{19}$N$_2$B, 358.1641, found 358.1641.

The invention claimed is:

1. A method for preparing a four-coordinated organic boron compound comprising reacting a bidentate compound capable of coordination at a N or O position with an aryl, heteroaryl, or vinyl-functional boronic acid, boroxine, or borate compound in a solvent in the presence of a base,
wherein the amount of the solvent used in the reaction is controlled to adjust the concentration of the bidentate compound to be 0.05 mol % or less,
wherein the bidentate compound is a compound represented by:

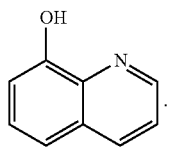

2. The method of claim 1, wherein the amount of the solvent used in the reaction is controlled to adjust the concentration of the bidentate compound to be in the range of 0.005 mol % to 0.05 mol %.

3. The method of claim 1, wherein the aryl, heteroaryl, or vinyl-functional boronic acid, boroxine, or borate compound is a compound represented by Formula 6, Formula 7, or Formula 8 below:

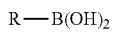 [Formula 6]

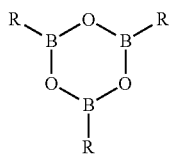 [Formula 7]

 [Formula 8]

wherein, in the above formulas,
R is C$_{6-50}$ aryl, C$_{2-50}$ alkenyl, or heteroaryl having 5 to 50 atoms; and optionally, is substituted with halogen, C$_{1-6}$ alkoxy, C$_{1-6}$ alkyl, C$_{2-6}$ alkenyl, C$_{6-10}$ aryl, C$_{3-10}$ cycloalkyl, C$_{7-20}$ aralkyloxy, C$_{7-11}$ arylcarbonyl, unsubstituted or substituted amino, C$_{6-10}$ aryloxy, carbonyl, or cyano.

4. The method of claim 1, wherein the aryl, heteroaryl, or vinyl-functional boronic acid, boroxine, or borate compound is a compound selected from the group consisting of:

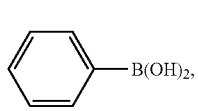 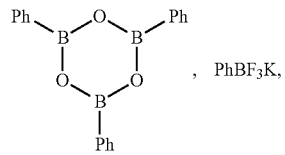

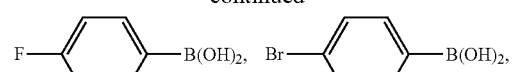

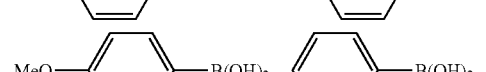

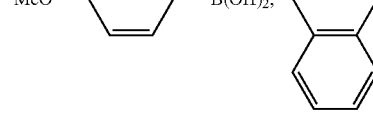

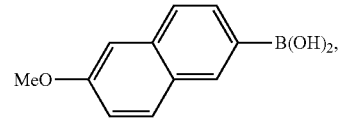

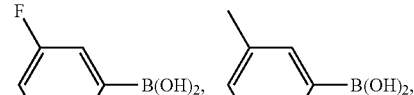

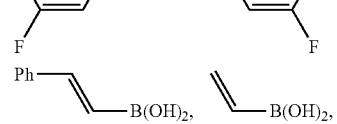

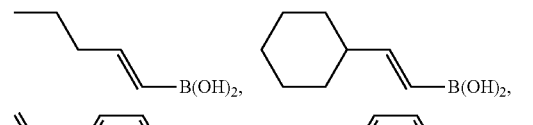

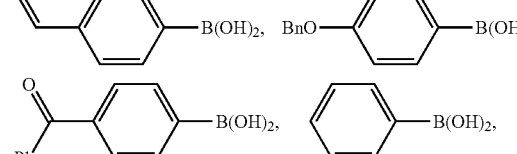

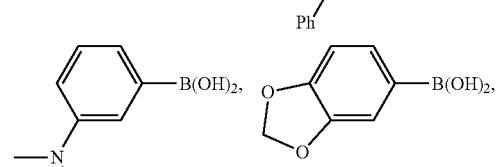

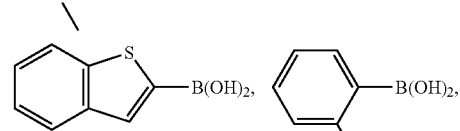

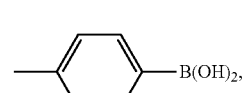

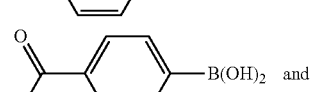

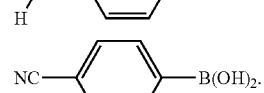

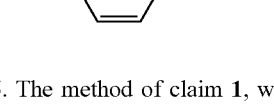

5. The method of claim 1, wherein the four-coordinated organic boron compound is a compound selected from the group consisting of:

-continued
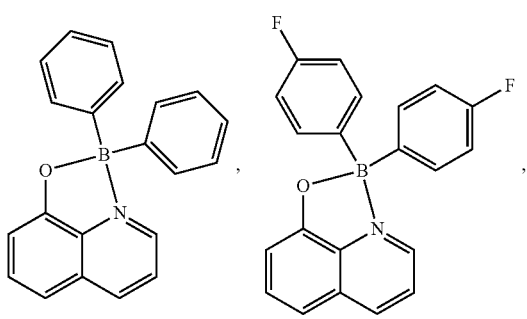
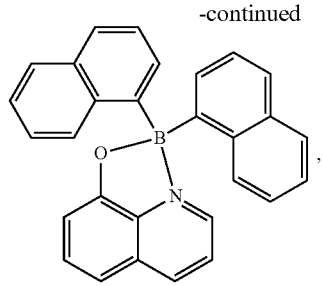
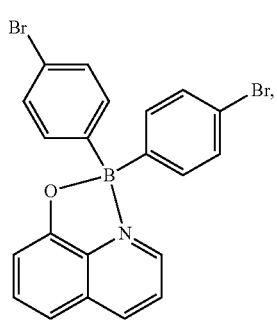
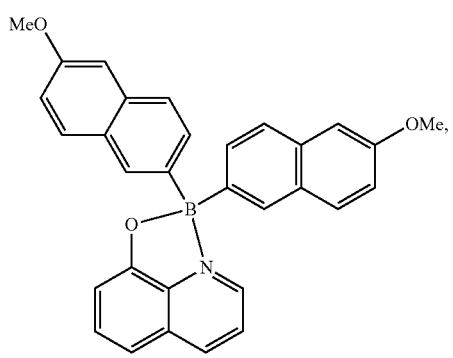
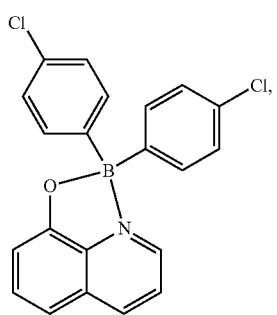
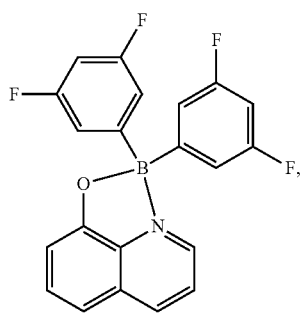
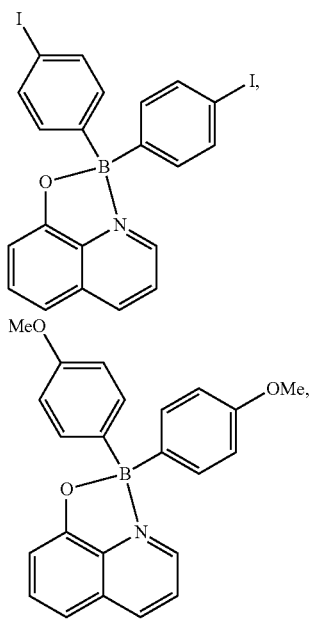
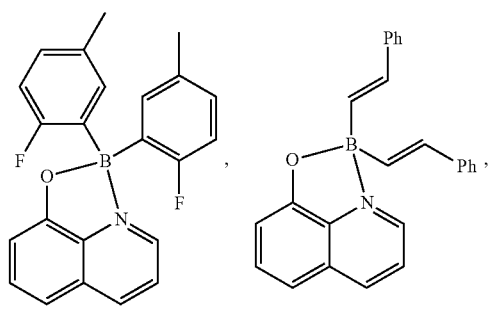
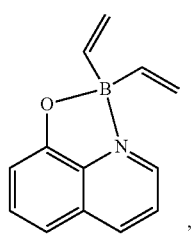

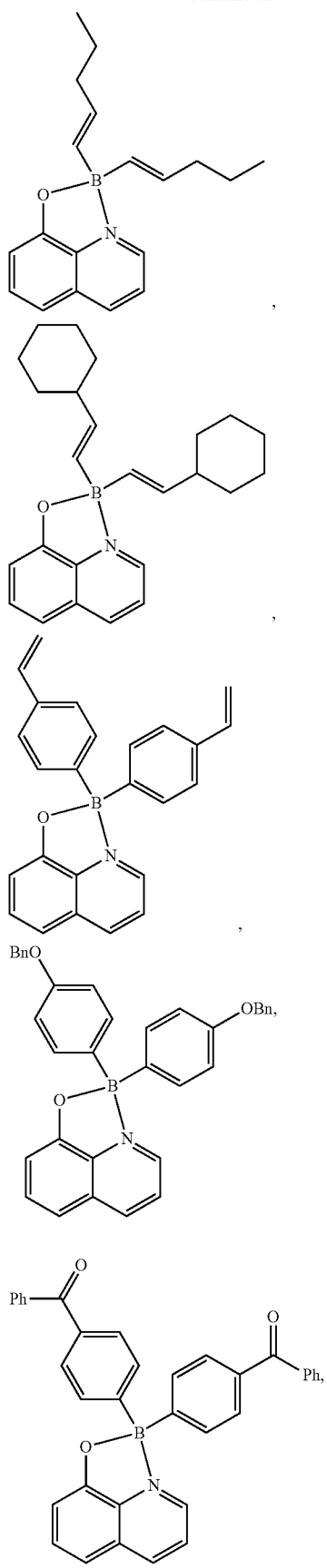
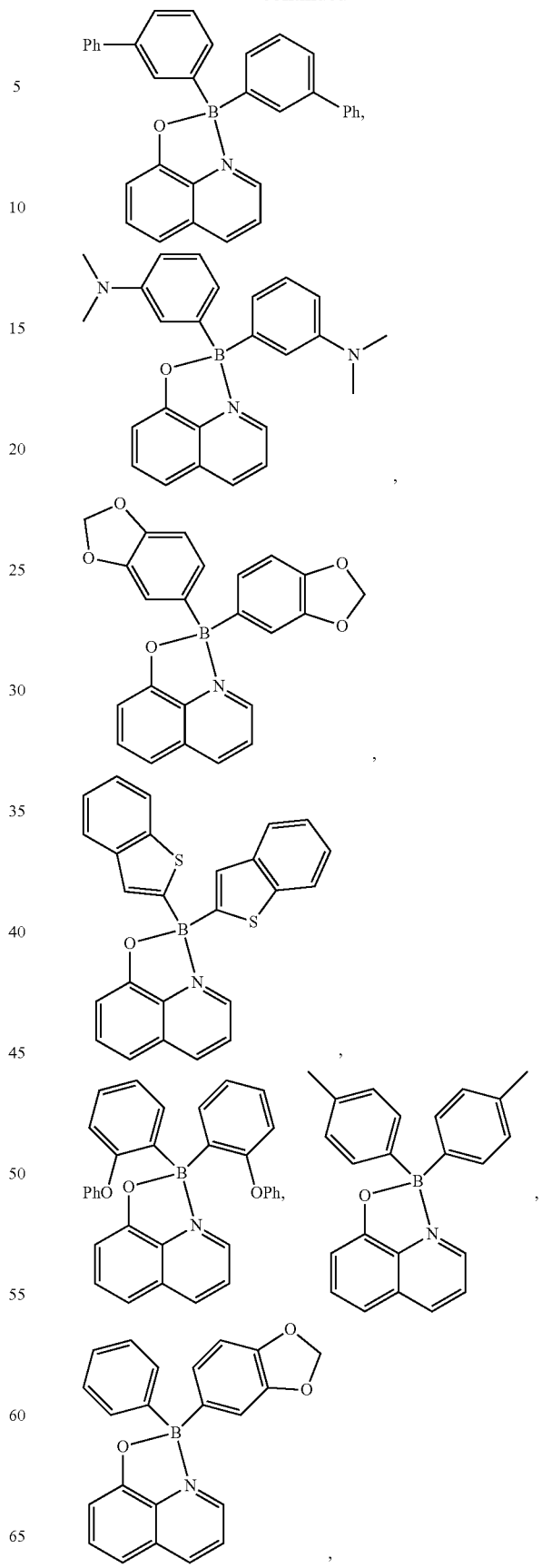

-continued

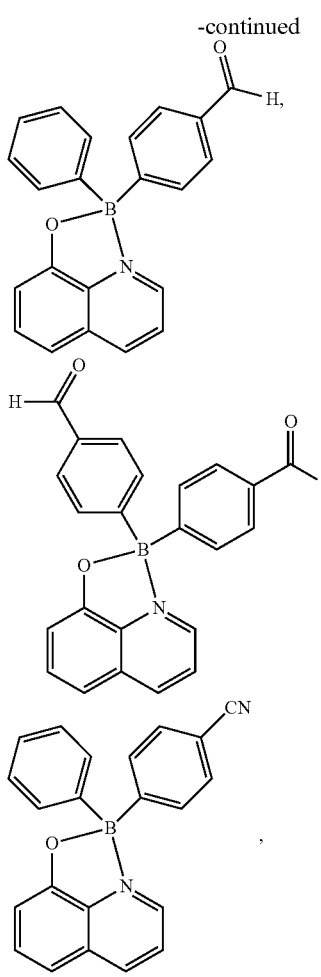

6. The method of claim 1, wherein the solvent used in the reaction is 1,4-dioxane, toluene, ethanol, dimethylformamide (DMF), or a mixed solvent thereof.

7. The method of claim 1, wherein the base used in the reaction is $K_3PO_4$, $Cs_2CO_3$, KOH, triethylamine ($Et_3N$), N,N-diisopropylethylamine ($i$-$Pr_2NEt$), or a mixture thereof.

8. A four-coordinated organic boron compound selected from

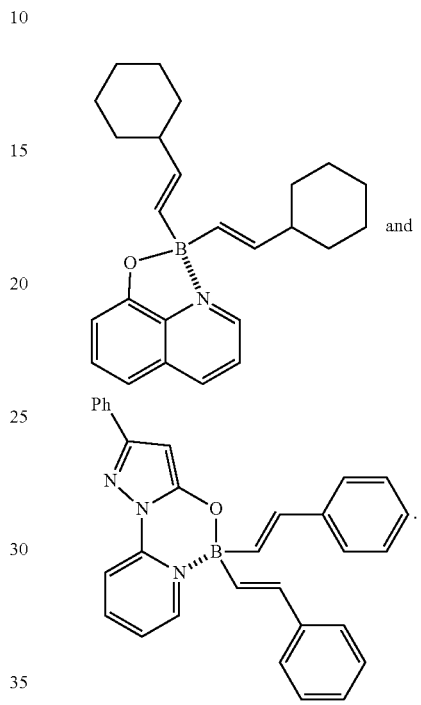

* * * * *